(12) United States Patent
Irving et al.

(10) Patent No.: US 9,329,482 B2
(45) Date of Patent: May 3, 2016

(54) FORMING CONDUCTIVE METAL PATTERNS USING THIOSULFATE COPOLYMERS

(71) Applicants: Mark Edward Irving, Rochester, NY (US); Thomas B. Brust, Webster, NY (US); Grace Ann Bennett, Scottsville, NY (US)

(72) Inventors: Mark Edward Irving, Rochester, NY (US); Thomas B. Brust, Webster, NY (US); Grace Ann Bennett, Scottsville, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 21 days.

(21) Appl. No.: 14/249,390

(22) Filed: Apr. 10, 2014

(65) Prior Publication Data

US 2015/0293451 A1 Oct. 15, 2015

(51) Int. Cl.
*G03F 7/004* (2006.01)
*G03F 7/16* (2006.01)
*G03F 7/20* (2006.01)
*G03F 7/038* (2006.01)

(52) U.S. Cl.
CPC ............. *G03F 7/16* (2013.01); *G03F 7/0384* (2013.01); *G03F 7/2002* (2013.01)

(58) Field of Classification Search
USPC .................................................. 430/18, 285.1
See application file for complete search history.

(56) References Cited

U.S. PATENT DOCUMENTS

| | | |
|---|---|---|
| 5,985,514 A | 11/1999 | Zheng et al. |
| 6,136,503 A | 10/2000 | Zheng et al. |
| 6,146,812 A | 11/2000 | Leon et al. |
| 6,420,505 B1 | 7/2002 | Blevins et al. |
| 6,465,152 B1 | 10/2002 | DoMinh et al. |
| 2014/0287365 A1* | 9/2014 | Shukla ............ G03F 7/30 430/325 |

* cited by examiner

*Primary Examiner* — Daborah Chacko Davis
(74) *Attorney, Agent, or Firm* — J. Lanny Tucker

(57) ABSTRACT

A conductive pattern can be formed using a polymeric layer that contains a reactive composition that comprises a reactive polymer that is metal ion-complexing, water-soluble, and crosslinkable. This reactive polymer comprises pendant thiosulfate groups as well as metal ion-complexing and water solubilizing groups. The reactive composition can be pattern-wise exposed to suitable radiation to induce crosslinking within the reactive polymer. The reactive composition and reactive polymer in the non-exposed regions can be removed due to their aqueous solubility, but the exposed regions of the polymeric layer are contacted with electroless seed metal ions, which are then reduced. The resulting electroless seed metal nuclei are electrolessly plated with a suitable metal to form the desired conductive pattern. Various articles can be prepared during this process, and the product article can be incorporated into various electronic devices.

10 Claims, No Drawings

FORMING CONDUCTIVE METAL PATTERNS USING THIOSULFATE COPOLYMERS

RELATED APPLICATIONS

U.S. Ser. No. 14/158,883 filed on Jan. 20, 2014 by Shukla Mis, and Meyer, which is a Continuation-in-part application of U.S. Ser. No. 13/846,985 filed on Mar. 19, 2013 that is now abandoned.

U.S. Ser. No. 14/158,884 filed on Jan. 20, 2014 by Shukla, Donovan, and Mis which is a Continuation-in-part application of U.S. Ser. No. 13/847,031, filed on Mar. 19, 2013 that is now abandoned.

U.S. Ser. No. 14/158,890 filed on Jan. 20, 2014 by Shukla and Donovan, which is a Continuation-in-part application of U.S. Ser. No. 13/847,049, filed on Mar. 19, 2013 that is now abandoned.

U.S. Ser. No. 14/158,897 filed on Jan. 20, 2014 by Mis and Shukla, which is a Continuation-in-part application of U.S. Ser. No. 13/847,063, filed on Mar. 19, 2013 that is now abandoned.

U.S. Ser. No. 14/158,902 filed on Jan. 20, 2014 by Shukla, Donovan, and Dirmyer, which is a Continuation-in-part application of U.S. Ser. No. 13/847,083, filed on Mar. 19, 2013 that is now abandoned.

FIELD OF THE INVENTION

This invention relates to methods for forming patterns of a reactive polymer that can be used for forming other material patterns such as conductive metallic patterns, for example using electroless plating. The invention is carried out using water-soluble thiosulfate reactive polymers that can be crosslinked upon suitable irradiation. This invention also relates to precursor, intermediate, and product articles related to the inventive method.

BACKGROUND OF THE INVENTION

In recent decades accompanying rapid advances in information-oriented society, there have also been rapid technological advances to provide devices and systems for gathering and communicating information. Of these, display devices have been designed for television screens, commercial signage, personal and laptop computers, personal display devices, and phones of all types, to name the most common information sharing devices.

As the increase in the use of such devices has exploded in frequency and necessity by displacing older technologies, there has been a concern that electromagnetic radiation emission from such devices may cause harm to the human body or neighboring devices or instruments over time. To diminish the potential effects from the electromagnetic radiation emission, display devices are designed with various transparent conductive materials that can be used as electromagnetic wave shielding materials.

In display devices where a continuous conductive film is not practical for providing this protection from electromagnetic radiation emission, it has been found that conductive mesh or patterns can be used for this electromagnetic wave shielding purpose for example as described in U.S. Pat. No. 7,934,966 (Sasaki et al.).

Other technologies have been developed to provide new microfabrication methods to provide metallic, two-dimensional, and three-dimensional structures with conductive metals. Patterns have been provided for these purposes using photolithography and imaging through mask materials as described for example in U.S. Pat. No. 7,399,579 (Deng et al.).

In addition, as the noted display devices have been developed in recent years, attraction has increased greatly for the use of touch screen technology whereby a light touch on a transparent screen surface with a finger or stylus can create signals to cause changes in screen views or cause the reception or sending of information, telecommunications, interaction with the internet, and many other features that are being developed at an ever-increasing pace of innovation. The touch screen technology has been made possible largely by the use of transparent conductive grids on the primary display so that the location of the noted touch on the screen surface can be detected by appropriate electrical circuitry and software.

For a number of years, touch screen displays have been prepared using indium tin oxide (ITO) coatings to create arrays of capacitive patterns or areas used to distinguish multiple point contacts. ITO can be readily patterned using known semiconductor fabrication methods including photolithography and high vacuum processing. However, the use of ITO coatings has a number of disadvantages. Indium is an expensive rare earth metal and is available in limited supply. Moreover, ITO is a ceramic material and is not easily bent or flexed and such coatings require expensive vacuum deposition methods and equipment. In addition, ITO conductivity is relatively low, requiring short line lengths to achieve desired response rates (upon touch). Touch screens used in large displays are broken up into smaller segments in order to reduce the conductive line length to provide acceptable electrical resistance. These smaller segments require additional driving and sensing electronics, further adding to the cost of the devices.

Silver is an ideal conductor having conductivity that is 50 to 100 times greater than that of ITO. Unlike most metal oxides, silver oxide is still reasonably conductive and its use reduces the problem of making reliable electrical connections. Moreover, silver is used in many commercial applications and is available from numerous commercial sources.

In other technologies, transparent polymeric films have been treated with conductive metals such as silver, copper, nickel, and aluminum by such methods as sputtering, ion plating, ion beam assist, wet coating, as well as the vacuum deposition. However, all of these technologies are expensive, tedious, or extremely complicated so that the relevant industries are spending considerable resources to design improved means for forming conductive patterns for various devices especially touch screen displays.

A similar level of transparency and conductivity for patterns can be achieved by producing very fine lines of about 5-6 µm in width of highly conductive material such as copper or silver metal or conductive polymers.

Crosslinkable polymers employing thiosulfate functionality are often referred to as Bunte salt polymers and are known for photo and thermal crosslinking applications. U.S. Pat. No. 6,465,152 (DoMinh et al.), U.S. Pat. No. 6,420,505 (Blevins et al.), U.S. Pat. No. 6,146,812 (Leon et al.), and U.S. Pat. No. 5,985,514 (Zheng et al.) describe the preparation of thiosulfate functionalized polymers and their use in thermally-sensitive lithographic printing plates.

While a variety of polymers have been developed for providing conductive patterns using electroless plating methods, such polymers are generally insoluble in water and must be coated out of expensive and sometimes toxic organic solvents.

There is a need for a way to make reactive polymer patterns that can be used for producing thin conductive lines using less expensive materials and plating techniques in order to achieve a substantial improvement in cost, reliability, and availability of conductive patterns for various display devices. It is desirable to achieve these results using aqueous formulations instead of organic solvent coating formulations. The present invention addresses this need as described in considerable detail below.

SUMMARY OF THE INVENTION

To address the problems noted above, the present invention provides a method of forming a pattern in a polymeric layer, the method comprising:

providing a polymeric layer comprising a reactive composition comprising a non-crosslinked thiosulfate copolymer comprising, in any order: (a) recurring units comprising pendant thiosulfate groups, and (b) recurring units comprising pendant carboxy, carboxylate, phospho, phosphonate, phosphate, sulfo, sulfonate, or sulfite groups, wherein the (a) recurring units are present in an amount of at least 1 mol % and up to and including 30 mol %, and the (b) recurring units are present in an amount of at least 70 mol % and up to and including 99 mol %, both based on total recurring units in the non-crosslinked thiosulfate copolymer, patternwise exposing the polymeric layer to radiation having a $\lambda_{max}$ of at least 150 nm that is sufficient to induce crosslinking within the non-crosslinked thiosulfate copolymer, to provide a polymeric layer comprising non-exposed regions and exposed regions comprising a crosslinked polymer derived from the non-crosslinked thiosulfate copolymer, optionally heating the polymeric layer simultaneously with or after patternwise exposing the polymeric layer but before removing the reactive composition comprising the non-crosslinked thiosulfate copolymer in the non-exposed regions, at a temperature sufficient to further crosslink the crosslinked polymer in the exposed regions of the polymeric layer, removing the reactive composition comprising the non-crosslinked thiosulfate copolymer in the non-exposed regions, contacting the exposed regions of the polymeric layer comprising crosslinked polymer with electroless seed metal ions to form a pattern of electroless seed metal ions in the exposed regions of the polymeric layer, reducing the pattern of electroless seed metal ions to provide a pattern of corresponding electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

A precursor article of the present invention can be used in the method of this invention, this precursor article comprising a substrate and having disposed thereon a polymeric layer comprising a reactive composition that comprises:

a non-crosslinked thiosulfate copolymer comprising, in any order: (a) recurring units comprising pendant thiosulfate groups, and (b) recurring units comprising pendant carboxy, carboxylate, phospho, phosphonate, phosphate, sulfo, sulfonate, or sulfite groups, wherein the (a) recurring units are present in an amount of at least 1 mol % and up to and including 30 mol %, and the (b) recurring units are present in an amount of at least 70 mol % and up to and including 99 mol %, both based on total recurring units in the non-crosslinked thiosulfate copolymer, and optionally, a photosensitizer.

An intermediate article provided during the practice of the present invention comprises a substrate and having disposed thereon a polymeric layer comprising exposed regions and non-exposed regions, the exposed regions comprising a pattern of at least partially crosslinked polymer that has been derived from a non-crosslinked thiosulfate copolymer comprising, in any order: (a) recurring units comprising pendant thiosulfate groups, and (b) recurring units comprising pendant carboxy, carboxylate, phospho, phosphonate, phosphate, sulfo, sulfonate, or sulfite groups, wherein the (a) recurring units are present in an amount of at least 1 mol % and up to and including 30 mol %, and the (b) recurring units are present in an amount of at least 70 mol % and up to and including 99 mol %, both based on total recurring units in the non-crosslinked thiosulfate copolymer, and the non-exposed regions comprising a reactive composition that comprises the non-crosslinked thiosulfate copolymer, and optionally, a photosensitizer.

Still another intermediate article provided during the practice of the present invention comprises a substrate and having disposed thereon a polymeric layer comprising exposed regions and non-exposed regions, the exposed regions comprising a pattern of at least partially crosslinked polymer that has been derived from a non-crosslinked thiosulfate copolymer comprising, in any order: (a) recurring units comprising pendant thiosulfate groups, and (b) recurring units comprising pendant carboxy, carboxylate, phospho, phosphonate, phosphate, sulfo, sulfonate, or sulfite groups, wherein the (a) recurring units are present in an amount of at least 1 mol % and up to and including 30 mol %, and the (b) recurring units are present in an amount of at least 70 mol % and up to and including 99 mol %, both based on total recurring units in the non-crosslinked thiosulfate copolymer, and the non-exposed regions comprising none of the non-crosslinked thiosulfate polymer.

Still another intermediate article generated during the practice of this invention comprises a substrate and having disposed thereon a polymeric layer comprising exposed regions and non-exposed regions, the exposed regions comprising a pattern of electroless seed metal ions complexed within an at least partially crosslinked polymer that has been derived from a non-crosslinked thiosulfate copolymer comprising, in any order: (a) recurring units comprising pendant thiosulfate groups, and (b) recurring units comprising pendant carboxy, carboxylate, phospho, phosphonate, phosphate, sulfo, sulfonate, or sulfite groups, wherein the (a) recurring units are present in an amount of at least 1 mol % and up to and including 30 mol %, and the (b) recurring units are present in an amount of at least 70 mol % and up to and including 99 mol %, both based on total recurring units in the non-crosslinked thiosulfate copolymer, and the non-exposed regions comprising none of the electroless seed metal ions or the non-crosslinked thiosulfate copolymer.

In addition, an intermediate article provided during the practice of the method of this invention comprises a substrate and having disposed thereon a polymeric layer comprising exposed regions and non-exposed regions, the exposed regions comprising a pattern of electroless seed metal nuclei complexed within an at least partially crosslinked polymer that has been derived from a non-crosslinked thiosulfate copolymer comprising, in any order: (a) recurring units comprising pendant thiosulfate groups, and (b) recurring units comprising pendant carboxy, carboxylate, phospho, phosphonate, phosphate, sulfo, sulfonate, or sulfite groups, wherein the (a) recurring units are present in an amount of at least 1 mol % and up to and including 30 mol %, and the (b) recurring units are present in an amount of at least 70 mol % and up to and including 99 mol %, both based on total recurring units in the non-crosslinked thiosulfate copolymer, and the non-exposed regions comprising none of the electroless seed metal nuclei or the non-crosslinked thiosulfate polymer.

A product article provided by the method of this invention comprises a substrate and having disposed thereon a polymeric layer comprising exposed regions and non-exposed regions, the exposed regions comprising a pattern of electrolessly plated metal within and deposited on the surface of an at least partially crosslinked polymer that has been derived from a non-crosslinked thiosulfate copolymer comprising, in any order: (a) recurring units comprising pendant thiosulfate groups, and (b) recurring units comprising pendant carboxy, carboxylate, phospho, phosphonate, phosphate, sulfo, sulfonate, or sulfite groups, wherein the (a) recurring units are present in an amount of at least 1 mol % and up to and including 30 mol %, and the (b) recurring units are present in an amount of at least 70 mol % and up to and including 99 mol %, both based on total recurring units in the non-crosslinked thiosulfate copolymer, and the non-exposed regions comprising none of the electrolessly plated metal or the non-crosslinked thiosulfate polymer.

The present invention provides fine conductive metal lines without using traditional high-cost semiconductor fabrication methods. It is also possible to use the present invention for these advantages because of the use of a unique copolymer that is water-soluble and can therefore be coated and processed using aqueous-based processing solutions. In addition, the unique copolymer also incorporates the required catalytic metal ion complexing properties and UV radiation-initiated crosslinking functionality such that no additional acid generating or photosensitizing compounds are required.

Use of the specifically designed copolymer described herein can become water-insoluble in the exposed regions of a polymeric layer. A pattern of water permeable but water-insoluble polymer can be formed on a suitable substrate when the copolymer in the non-exposed regions simply is washed away with a suitable aqueous bath such as a bath of distilled water, with or without an alkali such as a bicarbonate, carbonate, hydroxide, ammonia, or amine (such as triethanolamine or another alcoholamine). The remaining water-swellable and crosslinked polymer can then be treated with a catalytic metal ion bath such as silver nitrate where the metal ions will complex with the carboxylic acid groups in the crosslinked polymer. These complexed metal ions can then be reduced in a suitable reducing bath to form catalytic metal particles suitable for electroless metal plating of a variety of metals as described below. The UV radiation initiated crosslinking in the exposed regions forming the desired predetermined pattern is sufficient to keep the pattern from not dissolving in the electroless metal plating baths, while still allowing reactants and products of the electroless plating process to diffuse in and out of the polymer pattern.

The present invention therefore can be used to produce highly conductive metal patterns that exhibit high fidelity or correspondence to the ultraviolet radiation exposing pattern including the ability to easily produce 5 to 6 µm wide (or less) conductive metal lines that exhibit high conductivity (low resistivity).

DETAILED DESCRIPTION OF THE INVENTION

The following discussion is directed to various embodiments of the present invention and while some embodiments can be more desirable for specific uses, the disclosed embodiments should not be interpreted or otherwise considered to be limited to the scope of the present invention, as claimed below. In addition, one skilled in the art will understand that the following disclosure has broader application than is explicitly described and the discussion of any embodiment is not intended to limit the scope of the present invention to any described embodiment.

DEFINITIONS

As used herein to define various ethylenically unsaturated polymerizable monomer components (or recurring units) of the reactive polymers, solutions, reactive compositions, aqueous-based solutions, and polymeric layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard English language or chemical dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, or layer. Unless otherwise indicated, the percentages can be the same for either a dry layer or pattern, or for the total solids of the formulation or composition.

The term "homopolymer" is meant to refer to polymeric materials that have the same repeating or recurring unit along a polymer backbone. The term "copolymer" refers to polymeric materials composed of two or more different repeating or recurring units that are arranged in any order (randomly or otherwise) along the polymer backbone.

For reactive polymers used in the present invention, the recurring units can be arranged randomly along the polymer backbone, or there can be blocks of recurring units that occur naturally during the polymerization process.

Recurring units in reactive polymers described herein are generally derived from the corresponding ethylenically unsaturated polymerizable monomers used in a polymerization process, which ethylenically unsaturated polymerizable monomers have the desired functional and pendant groups. Alternatively, pendant groups can be incorporated within recurring units after polymerization of ethylenically unsaturated polymerizable monomers by reaction with requisite precursor pending groups.

The term "reactive polymer" is used herein to refer to the polymers described below that have the essential components and properties described and can be used in the method of the present invention.

A "thiosulfate" group is a substituent defined by the following Structure (I):

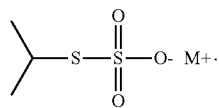

Any compound bearing this thiosulfate group is called a "thiosulfate compound." When the thiosulfate group is attached to an organic moiety, the resulting compound is an "organic thiosulfate" or Bunte salt. If this organic thiosulfate is a polymer (having a molecular weight of at least 1,000), the compound is considered a thiosulfate polymer.

By "solubility or dispersibility" in reference to the reactive polymer, we mean that a uniform stable solution or dispersion of reactive polymer can be prepared using a desired solvent at a solids concentration that is useful for use in the present invention, for example preparation of coating formulations.

The term "aqueous-based" refers to solutions, baths, or dispersions in which the predominant solvent, or at least 50 weight % of the solvents, is water.

Unless otherwise indicated, the term "mol %" when used in reference to recurring units in reactive polymers, refers to either the nominal (theoretical) amount of a recurring unit based on the molecular weight of ethylenically unsaturated polymerizable monomer used in the polymerization process, or to the actual amount of recurring unit in the resulting reactive polymer as determined using suitable analytical techniques and equipment.

Uses

The methods of this invention can be used to provide reactive polymer patterns that can be used to form conductive metal patterns as described herein, which conductive metal patterns can be incorporated into various devices including but not limited to touch screen or other display devices.

For example, the reactive compositions described herein can be used for a variety of purposes where efficient photopolymerization and metal pattern formation is needed in various articles or devices. Such reactive compositions must be sensitive to a chosen radiation wavelength as noted above. For example, the reactive compositions can be used in various methods that can provide conductive metal patterns, for example using electroless plating procedures, which conductive metal patterns can be incorporated into various devices including but not limited to touch screen or other display devices that can be used in numerous industrial, consumer, and commercial products.

For example, touch screen technology can comprise different touch sensor configurations including capacitive and resistive touch sensors. Resistive touch sensors comprise several layers that face each other with a gap between adjacent layers that may be preserved by spacers formed during manufacturing. A touch screen panel can comprise several layers including two thin, metallic, electrically conductive layers separated by a gap that can be created by spacers. When a object such as a stylus, palm, or finger presses down on a point on the panel's outer surface, the two metallic layers come into contact and a connection is formed that causes a change in the electrical current. This touch event is sent to a controller for further processing.

Capacitive touch sensors can be used in electronic devices with touch-sensitive features. These electronic devices can include but are not limited to, televisions, monitors, and projectors that can be adapted to display images including text, graphics, video images, movies, still images, and presentations. The image devices that can be used for these display devices that can include cathode ray tubes (CRS's), projectors, flat panel liquid crystal displays (LCD's), LED systems, OLED systems, plasma systems, electroluminescent displays (ECD's), and field emission displays (FED's). For example, the present invention can be used to prepare capacitive touch sensors that can be incorporated into electronic devices such as computing devices, computer displays, portable media players including e-readers, mobile telephones and other communicating devices.

Systems and methods of fabricating flexible and optically compliant touch sensors in a high-volume roll-to-roll manufacturing process wherein micro electrically conductive features can be created in a single pass are possible using the present invention. The reactive compositions can be used in such systems and methods with multiple printing members to form multiple high resolution conductive images from predetermined designs of patterns provided in those multiple printing members. Multiple patterns can be printed on one or both sides of a substrate. For example, one predetermined pattern can be printed on one side of the substrate and a different predetermined pattern can be printed on the opposing side of the substrate. The printed patterns of the photopolymerizable compositions can then be further processed to provide conductive metal patterns using electroless metal plating.

Reactive Polymers

The reactive polymers useful in this invention are polymers derived from at least two different essential ethylenically unsaturated polymerizable monomers. At least one of such essential ethylenically unsaturated monomers contains a pendant water-solubilizing groups (described below) or salts thereof or a precursor moiety that can be converted to water-solubilizing groups after polymerization. The other essential ethylenically unsaturated polymerizable monomers comprise a pendant thiosulfate salt group.

In their simplest form, the reactive polymers used in the present invention can be generally represented by the formula R—S—SO$_3$M, wherein R represents a suitable polymeric backbone, and M is a suitable cation. When R is a polymer backbone, it can have multiple —S—SO$_3$M groups distributed randomly or in blocks of recurring units along the chain of atoms forming the reactive polymer backbone. Useful reactive polymers that provide the backbone are described in more detail below. The reactive polymers can be formed as vinyl polymers from ethylenically unsaturated polymerizable monomers using emulsion or suspension polymerization techniques, or they can be condensation polymers formed using appropriate reactive precursor compounds (for example diols with diacids or diisocyanates to form polyesters or polyurethanes or diamines with diacids or diisocyanates to form polyamides or polyureas).

M is hydrogen or a suitable monovalent cation such as a metal cation or an organic cation including but not limited to, an alkali metal ion (lithium, sodium, potassium, and cesium), ammonium, pyridinium, morpholinium, benzolium, imidazolium, alkoxypyridinium, thiazolium, and quinolinium cations. Divalent cations can be present in small amounts so that premature crosslinking of the thiosulfate polymer is minimized. Thus, in most embodiments, M is a monovalent cation such as potassium ion or sodium ion.

Any polymer containing one or more thiosulfate moieties can be used in the present invention as long as they also comprise the water-solubilizing groups described below. For example, suitable polymers include but are not limited to, vinyl polymers derived at least in part from methacrylate or acrylate ethylenically unsaturated polymerizable monomers and polystyrenes (including copolymers derived from styrene and styrene derivatives having one or more thiosulfate moieties on the pendant benzene ring or attached along the polymer backbone). Such reactive polymers have an entirely carbon backbone. However, pendant thiosulfate groups can be incorporated into condensation polymers including but not limited to, polyesters, polyamides, polyurethanes, polycarbonates, polymers derived from cellulose esters, and polysiloxanes using chemistry that would be readily known to one skilled in the art.

In the reactive polymer, a thiosulfate group or moiety can be represented by the following Structure (II):

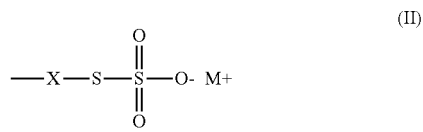

wherein X is a suitable divalent linking group that is attached to a polymer backbone, and M+ is a cation as defined for M above.

Useful X divalent linking groups in Structure (II) include but are not limited to, —(COO)$_n$—(Z)$_m$— wherein n is 0 or 1 and m is 0 or 1. Z can be a substituted or unsubstituted divalent aliphatic group having 1 to 6 carbon atoms including alkylene groups (such as methylene, ethylene, n-propylene, isopropylene, butylenes, 2-hydroxypropylene and 2-hydroxy-4-azahexylene), which divalent aliphatic group can comprise one or more oxygen, nitrogen or sulfur atoms in the chain (such as carbonamido, sulfonamide, alkylenecarbonyloxy, ureylene, carbonyloxy, sulfonyloxy, oxy, dioxy, thio, dithio, seleno, sulfonyl, sulfonyl, and imido), a substituted or unsubstituted arylene group having 6 to 14 carbon atoms in the aromatic ring (such as phenylene, naphthalene, anthracylene, and xylylene), a substituted or unsubstituted combination of alkylene and arylene groups such as substituted or unsubstituted arylenealkylene or alkylenearylene groups having at least 7 and up to and including 20 carbon atoms in the chain (such as p-methylenephenylene, phenylenemethylenephenylene, biphenylene, and phenyleneisopropylene-phenylene), or a heterocyclic ring (such as pyridinylene, quinolinylene, thiazolinylene, and benzothioazolylene). In addition, X can be a substituted or unsubstituted alkylene group, a substituted or unsubstituted arylene group, in a substituted or unsubstituted arylenealkylene group or alkylenearylene group, having the same definitions as Z. In some embodiments, it is advantageous to covalently attach both a thiosulfate group and an electron-accepting photosensitizer group in the same pendant group in a single recurring unit. Thus, in Structure II, X can be or be derived from an electron-accepting photosensitizer component as described below.

As the thiosulfate group is generally located pendant to the polymer backbone, it can be part of an ethylenically unsaturated polymerizable monomer that can be polymerized using conventional techniques to form vinyl copolymers when copolymerized with one or more additional ethylenically unsaturated polymerizable monomers as described below. A reactive polymer can include more than one type of recurring unit containing thiosulfate group as described herein. For example, the reactive polymers can comprise different recurring units derived from two or more different ethylenically unsaturated polymerizable monomers. Alternatively, the reactive polymer can be have the same or different backbone in each recurring unit, but comprise different thiosulfate groups as defined by different X (with different "n", "m", or Z groups) as noted above for Structure (II).

More specifically, the reactive polymers useful in the practice of this invention have two essential features: (1) they comprise pendant thiosulfate groups as described above that upon exposure to suitable radiation can participate in crosslinking by forming disulfide bonds, and (2) reactive water-solubilizing groups. While the reactive polymers can be supplied as aqueous-based reactive compositions, they are best used when applied to a substrate that can have a large or small surface, including the outer surfaces of inorganic or organic particles and then dried. Thus, the reactive polymers are metal ion-complexing (as described below), water-soluble, and crosslinkable.

Upon exposure of the reactive polymer to suitable radiation having a $\lambda_{max}$ of at least 150 nm and up to and including 700 nm, or more likely exposed to radiation having a $\lambda_{max}$ of at least 150 nm and up to and including 450 nm (sometimes known as "short UV"), the pendant groups are electronically excited such that they likely form sulfide radicals that can react with other radicals to form crosslinks within the reacted polymer. Thus, essential crosslinking can be accomplished using the reactive polymer without additional crosslinking agents. However, if desired, crosslinking can be further provided using distinct compounds that are dispersed as crosslinking agents within the polymeric layer (described below) comprising one or more reactive polymers. Such crosslinking agents react at the pendant thiosulfate groups or at the pendant water solubilizing groups depending upon the chemical structure of crosslinking agent. For example, incorporated aziridines or carbodiimides can react with reactive water-solubilizing groups such as pendant carboxy (carboxylic acid) groups.

Particularly useful reactive polymers can be represented by the following essential -A-, -B-, and optional -C- recurring units arranged in any order along the polymer backbone.

In particular, the essential -A- recurring units, or (a) recurring units, can be derived from any ethylenically unsaturated polymerizable monomer having appropriate pendant thiosulfate groups as defined above. More particularly, the -A- recurring units can be further defined in reference to the following Structure (-A-):

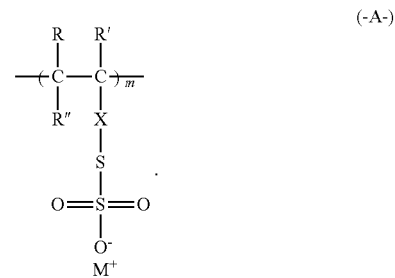

In this structure, X and M$^+$ are as described above, and R, R', and R" are as described below.

Some particularly useful ethylenically unsaturated polymerizable monomers from which -A- recurring units can be derived, include:
p-vinylbenzyl thiosulfate sodium salt,
2-sodium thiosulfate ethyl methacrylate,
3-(methacryloxy)-2-hydroxypropyl thiosulfate sodium salt, N-(3-(methacryloxy)-2-hydroxypropyl)aminoethylthiosulfate sodium salt, and 2-sodium thiosulfate ethyl acrylate.

Some of the reactive polymers useful in the present invention can be obtained from various commercial sources. In other embodiments, the reactive polymer can be prepared in several ways using understanding and reactants available to a skilled polymer chemist. For example, the useful thiosulfate monomers and reactive ethylenically unsaturated polymerizable co-monomers can be obtained from a number of commercial sources or readily prepared, and then polymerized using known conditions.

Thiosulfate-containing ethylenically unsaturated polymerizable monomers can be prepared from the reaction between an alkyl halide and thiosulfate salt as described in the seminal teaching of Bunte, *Chem. Ber.* 7, 646, 1884. Thiosulfate polymers can be prepared either from functional ethylenically unsaturated polymerizable monomers or from preformed polymers having requisite reactive groups. For example, if the functional ethylenically unsaturated polymerizable monomer is a vinyl halide polymer, the functional vinyl polymerizable monomer can be prepared as illustrated as follows:

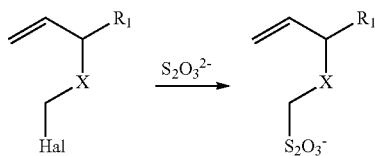

wherein $R_1$ is hydrogen or a substituted or unsubstituted alkyl group comprising 1 to 10 carbon atoms or an aryl group, Hal represents a halide, and X represents a divalent linking group as defined above. The conditions for these reactions are known in the art.

Reactive polymers containing pendant thiosulfate groups can also be prepared from preformed polymers in a similar manner as described in U.S. Pat. No. 3,706,706 (Vandenberg), the disclosure of which is incorporated herein by reference for the polymer synthetic methods:

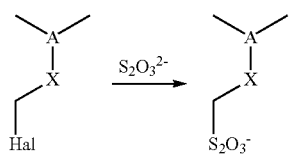

wherein A represents the polymer backbone, Hal represents a halide, and X represents a divalent linking group as described above.

In addition, reactive polymers containing pendant thiosulfate groups can be prepared using the reaction of an alkyl epoxide (on a preformed polymer or a functional monomer) with a thiosulfate salt, or between an alkyl epoxide (on a preformed polymer of a functional monomer) and a molecule containing a thiosulfate moiety (such as 2-aminoethanethiosulfuric acid), as illustrated by Thames, *Surf. Coating,* 3 (*Waterborne Coat.*), Chapter 3, pp. 125-153, Wilson et al (Eds.) and as follows:

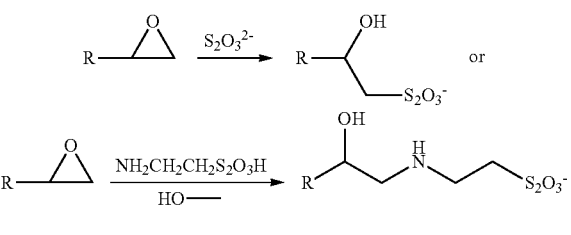

wherein R represents a substituted or unsubstituted alkyl or aryl groups. The conditions for these reactions are known in the art and require only routine experimentation to complete.

Useful essential -B- recurring units, or (b) recurring units, within the reactive polymer can be derived from any ethylenically unsaturated polymerizable monomer that comprises pendant water-solubilizing groups, or pendant precursor groups that can be converted to water-solubilizing groups after polymerization. Such pendant water-solubilizing groups are also generally metal ion-complexing (or metal ion-reactive) and include but are not limited to, carboxylic acid, sulfonic acid, and phosphonic acid groups as well as neutralized salts of these acid groups (such as carboxylate and sulfonate groups). The sulfonic acid, sulfonate, carboxylic acid, and carboxylate groups are particularly useful. Other useful pendant water-solubilizing groups would be readily apparent to one skilled in the art. Useful pendant precursor groups include but are not limited to, anhydrides, esters (such as tertiary alkyl esters), alcohols, and benzyl groups such as iminobenzyl sulfonates and nitrobenzyl sulfonates.

For example, the essential -B- recurring units can be represented by the following Structure (-B-):

wherein B' represents a pendant group comprising the desired water-solubilizing group (noted above) or precursor groups, which group can be directly attached to the reactive polymer backbone or it can be attached through a suitable divalent linking group (for example, as defined for the -A- recurring units). R, R', and R" are as described below.

For example, some useful ethylenically unsaturated polymerizable monomers from which the -B- recurring units can be derived include but are not limited to, acrylic acid, methacrylic acid, styrene sulfonic acid, itaconic acid, maleic anhydride, fumaric acid, citraconic acid, vinyl benzoic acid, 2-carboxyethyl acrylate, 2-carboxyethyl methacrylate, 2-acrylamido-2-methyl-1-propane sulfonic acid, and 2-sulfoethyl methacrylate. Partially or fully neutralized counterparts of these monomers are also useful. Acrylic acid and methacrylate acid are particularly useful. These acidic -B- recurring units can be suitably partially or fully neutralized using alkali metal cations or suitable organic amines.

In addition to the -A- and -B- recurring units described above that are essential in the particularly useful reactive polymers, the reactive polymers can further comprise one or more additional recurring units that are different from all -A- and -B- recurring units, and herein identified as optional -C- recurring units, or (c) recurring units. A skilled polymer chemist would understand how to choose such additional recurring units, and for example, they can be derived from one or more ethylenically unsaturated polymerizable monomers selected from the group consisting of alkyl acrylates including hydroxyalkyl acrylates, alkyl methacrylates including hydroxyalkyl methacrylates, (meth)acrylamides, styrene and styrene derivatives, vinyl ethers, vinyl benzoates, vinylidene halides, vinyl halides, vinyl imides, and other materials that a skilled worker in the art would understand could provide desirable properties to the reactive polymer. Such -C- recurring units can be represented by the following Structure (-C-):

wherein the D groups in the -C- recurring units can be for example, hydrogen, substituted or unsubstituted alkyl groups (such as hydroxyalkyl groups), substituted or unsubstituted aryl groups (such as substituted or unsubstituted phenyl groups including those found in styrene), alkyl ester groups, aryl ester groups, halogens, or ether groups. In many useful -C- recurring units, the D groups are alkyl carboxyl ester groups wherein the alkyl moiety has 1 to 6 carbon atoms and is linear, branched, or cyclic in form. R, R', and R" are as described above.

In addition, some -C- recurring units can comprise an epoxy (such as a glycidyl group) or epithiopropyl group derived for example from glycidyl methacrylate or glycidyl acrylate.

In the noted -A-, -B-, and -C- recurring units shown above, R, R', and R" can be the same or different hydrogen, methyl, ethyl, or chloro groups and each type of recurring unit can have the same or different R, R', and R" groups along the polymer backbone. In most embodiments, R, R', and R" are hydrogen or methyl, and R, R', and R" can be the same or different for the various -B-, and -C- recurring units in a given reactive polymer.

In the -A-, -B-, and -C- recurring unit formulae shown above, "m", "n", and "p" are used to represent the respective molar amounts of recurring units, based on total recurring units, in a given reactive polymer, so that the sum of m, n, and p equal 100 mol % in a given reactive polymer. However, it is to be understood that "m" and "n" do not only refer to the amounts of the -A- and -B- recurring units, but to all recurring units in the reactive polymer that provide the desired functionalities (crosslinking and water-solubility) as described above. In general, m is at least 1 mol %, or even at least 2 mol % and up to and including 30 mol %, or at least 5 mol % and up to and including 20 mol %, based on the total recurring units in the reactive polymer. In addition, n generally represents at least 70 mol % and up to and including 99 mol %, or more typically at least 70 mol % and up to and including 95 mol %, or even at least 75 mol % and up to and including 85 mol %, based on the total recurring units in the reactive polymer.

Moreover, while p can be 0 mol %, it also can be up to and including 30 mol %, or typically at least 1 mol % and up to and including 25 mol %, or at least 2 mol % and up to and including 20 mol %, based on the total recurring units in the reactive polymer.

The mol % amounts of the various recurring units defined herein for the reactive polymers defined herein are meant to refer to the actual molar amounts present in the reactive polymers. It is understood by one skilled in the art that the actual mol % values may differ from those theoretically possible (nominal mol %) from the amount of ethylenically unsaturated polymerizable monomers that are used in the polymerization procedure. However, under most polymerization conditions that allow high polymer yield and optimal reaction of all monomers, the actual mol % of each monomer is generally within ±15 mol % of the theoretical amounts.

Some representative reactive polymer embodiments include but are not limited to, the following copolymers and terpolymers wherein the molar ratios are theoretical (nominal) amounts based on the actual molar ratio of ethylenically unsaturated polymerizable monomers used in the polymerization process. The actual molar amounts of recurring units can differ from the theoretical (nominal) amounts of monomers if the polymerization reactions are not carried out to completion.

Poly(methacrylic acid-co-p-vinylbenzyl thiosulfate sodium salt) (98:2);

Poly(acrylic acid-co-p-vinylbenzyl thiosulfate sodium salt) (80:20);

Poly(methacrylic acid-co-p-vinylbenzyl thiosulfate potassium salt) (75:25);

Poly(2-acrylamindo-2-methyl-1-propanesulfonic acid-co-2-sodium thiosulfate ethyl methacrylate) (90:10);

Poly(2-carboxyethyl methacrylate-co-vinylbenyzl thiosulfate sodium salt-co-glycidyl methacrylate) (80:15:5); and Poly(2-sulfoethyl methacrylate-co-2-sodium thiosulfate ethyl methacrylate-co-2-hydroxyethyl methacrylate) (75:15:10);

Poly(styrene sulfonate sodium salt-co-p-vinylbenzyl thiosulfate sodium salt) (70:30); and Poly(methacrylic acid-co-p-vinylbenzyl thiosulfate sodium salt-co-2-sulfoethyl methacrylate) (50:30:20).

Useful reactive polymers generally have a molecular weight ($M_n$) of at least 1,000 and up to and including 1,000,000, or typically at least 10,000 and up to and including 100,000, as determined using size exclusion chromatography (SEC).

Useful reactive polymers can also have a glass transition temperature ($T_g$) of at least 20° C. and up to and including 250° C. or at least 20° C. and up to and including 150° C., as determined using Differential Scanning calorimetry (DSC).

The reactive polymers can be prepared using known free radical solution polymerization techniques using known starting materials, free radical initiators, and reaction conditions in suitable organic solvents such as tetrahydrofuran that can be adapted from known polymer chemistry. Where starting materials (such as ethylenically unsaturated polymerizable monomers) are not available commercially, such starting materials can be synthesized using known chemical starting materials and procedures.

Representative preparations of useful reactive polymers are provided below for the Invention Examples. Additional details of polymerization procedures and starting materials can be found in U.S. Pat. No. 3,799,915 (noted above), the disclosure of such details being incorporated herein by reference. For example, once the reactive polymer is prepared in a suitable organic reaction solvent, it can be extracted into water by partial or complete neutralization of the water-solubilizing groups to render the reactive polymer highly water soluble. This aqueous solution of the neutralized reactive polymer can be diluted or concentrated as desired for application to a substrate, and is generally present at a concentration of less than 20 weight %.

In general, the reactive polymers can be stored in solution in suitable aqueous solutions or dispersions. Depending upon the sensitivity of the reactive polymer to light (such as room light), during and after preparation, the reactive polymers can be kept in the dark or away from light exposure until they are formulated into reactive compositions and used for various purposes. To enhance storage stability, one or more acid scavengers, such as hindered amines, can be added to the reactive polymer solution during or after polymerization. A skilled polymer chemist would know what compounds would be suitable as acid scavengers and how much to use with a particular reactive polymer and desired storage stability.

Reactive Compositions

The reactive polymers described herein can be incorporated and used in reactive compositions incorporated into polymeric layers in various methods for forming conductive patterns, for example using electroless plating.

Each reactive composition has only one essential component, that is, one or more reactive polymers as described above that can be crosslinked upon exposure to radiation having $\lambda_{max}$ of at least 150 nm and up to and including 700 nm, or of at least 150 nm and up to and including 450 nm, as described below, which reactive polymers also comprise pendant water-solubilizing groups as described above. While various other optional components can be included as described below, only the reactive polymer is essential for providing the desired precursor article, intermediate articles, product articles, and conductive electroless metal plated pattern in the reactive composition forming the polymeric layer as described herein.

One or more reactive polymers are generally present in the reactive composition (and in the resulting dry polymeric layer) in an amount of at least 50 weight % and up to and including 100 weight %, or typically at least 80 weight % and up to and including 98 weight %, based on the total solids in the reactive composition (or total dry weight of the polymeric layer).

The reactive compositions generally do not include separate crosslinking agents or crosslinking agent precursors because the reactive polymer itself includes sufficient pendant crosslinkable groups. However, as noted above, the -C-recurring units can also include additional crosslinking groups such as pendant epoxy groups.

While not essential, it is sometimes desirable to enhance the sensitivity of some reactive polymers to longer wavelengths (for example, at least 300 nm and up to and including 700 nm, or at least 150 nm and up to and including 450 nm) by including one or more photosensitizers in the reactive composition used in this invention. A variety of photosensitizers are known in the art such as organic photosensitizer N-containing heterocyclic compounds such as azinium salts, oxyazinium salts, thiazolium salts, pyrylium salts, naphthalene diimides, and naphthalene imides.

Representative photosensitizers include but are not limited to, cyano-substituted carbocyclic aromatic compounds or cyanoaromatic compounds (such as 1-cyanonaphthalene, 1,4-dicyanonaphthalene, 9,10-dicyanoanthracene, 2-t-butyl-9,10-dicyanoanthracene, 2,6-di-t-butyl-9,10-dicyanoanthracene, 2,9,10-tricyanoanthracene, 2,6,9,10-tetracyanoanthracene), aromatic anhydrides and aromatic imides (such as 1,8-naphthylene dicarboxylic, 1,4,6,8-naphthalene tetracarboxylic, 3,4-perylene dicarboxylic, and 3,4,9,10-perylene tetracarboxylic anhydride or imide), condensed pyridinium salts (such as quinolinium, isoquinolinium, phenanthridinium, acridinium salts), and pyrylium salts.

Other useful photosensitizers are inorganic salts or complexes such as transition metal salts and complexes, wherein the metal salts can include but are not limited to, copper sulfate, nickel chloride, copper nitrate, zinc acetate, ferric chloride, and others that would be readily apparent to one skilled in the art using the teaching herein.

For example, the reactive composition can further comprise a complexing metal ions, such as stannous, ferric, cobalt, silver, palladium, platinum, or gold ions.

Particularly useful photosensitizers are electron acceptor and water soluble compounds such as 4-phenylpyridinium-N-propane-3-sulfonate and N-ethoxypyridinium tetrafluoroborate.

One or more photosensitizers can be present in the reactive composition (and resulting dry polymeric layer) in an amount of at least 0.1 weight % and up to and including 10 weight %, or more likely at least 0.5 weight % and up to and including 5 weight %, based on the total solids in the reactive composition (or total dry weight of the polymeric layer).

The reactive compositions can optionally include one or more addenda such as film-forming compounds, surfactants, plasticizers, filter dyes, viscosity modifiers, and any other components that would be readily apparent to one skilled in the art, and such addenda can be present in amounts that would also be readily apparent to one skilled in the art.

The essential reactive polymer and any optional compounds described above are generally dissolved or dispersed in water or a mixture of water and water-miscible organic solvents to form a reactive composition that can be applied to a suitable substrate (described below) in a suitable manner. Useful water-miscible organic solvents include but are not limited to, alcohols such as methanol, ethanol, and isopropanol.

Articles

The reactive composition described above can be applied to a suitable substrate using any suitable method including but not limited to, spin coating, bead coating, blade coating, curtain coating, or spray coating, from a suitable reservoir to form a polymeric layer. Useful substrates can be chosen for particular use or method as long as the substrate material will not be degraded by the reactive composition or any treatments to which the resulting precursor articles are subjected during the method of this invention. The reactive composition can be applied multiple times if desired to obtain a thicker coating (reactive polymer layer) of the reactive composition, and dried between each coating or dried only after the last application. Water and any water-miscible organic solvents can be removed from the reactive composition using any suitable drying technique.

In general, the final dry coating of reactive composition (polymeric layer) can have an average dry thickness of at least 10 nm and up to and including 1 mm, with a dry thickness of at least 0.1 μm and up to and including 100 μm being more useful. The average dry thickness can be determined by measuring the dry layer thickness in at least 10 different places within a 10 cm by 10 cm square of the dry reactive layer using an electron microscope or other suitable analytical device.

Thus, useful substrates can be composed of glass, quartz, and ceramics as well as a wide variety of flexible materials such as cellulosic papers and polyesters including poly(ethylene terephthalate) and poly(ethylene naphthalate), polycarbonates, polyamides, poly(meth)acrylates, and polyolefins. Useful polymeric substrates can be formed by casting or extrusion methods. Laminates of various substrate materials can also be put together to form a composite substrate. Any of the substrates can be treated to improve adhesion using for example corona discharge, oxygen plasma, ozone or chemical treatments using silane compounds such as aminopropyltriethoxysilane. The substrates can be of any suitable dry thickness including but not limited to at least 10 µm and up to and including 10 mm, depending upon the intended use of the resulting articles.

Particularly useful substrates are composed of poly(ethylene terephthalate) such as biaxially oriented poly(ethylene terephthalate) (PET) films that have broad uses in the electronics market. These PET films, ranging in dry thickness of at least 50 µm and up to and including 200 µm, can also comprise, on at least one side, a polymeric primer layer (also known as a subbing layer, adhesive layer, or binder layer) that can be added prior to or after film stretching. Such polymeric primer layers can comprise poly(acrylonitrile-co-vinylidene chloride-co-acrylic acid), poly(methyl acrylate-co-vinylidene chloride-co-itaconic acid), poly(glycidyl methacrylate-co-butyl acrylate), or various water-dispersible polyesters, water-dispersible polyurethanes, or water-dispersible polyacrylics, as well as sub-micrometer silica particles. The dry thickness of the primer layer can be at least 0.1 µm and up to and including 1 p.m.

Thus, with the application of the described reactive composition to a suitable substrate, with or without appropriate drying, the present invention provides a precursor article comprising a substrate and having disposed thereon a polymeric layer comprising the reactive composition described above that comprises the reactive polymer that is metal ion-complexing, water-soluble, and crosslinkable, and optionally, a photosensitizer.

Uses of Reactive Compositions

The reactive compositions described herein can be used to form reactive polymer patterns (or patterns of the reactive compositions) that can be used as described below to form surface electrically conductive patterns for various purposes as described above. The following discussion provides some details about representative electroless plating methods in which the reactive compositions described herein can be used.

In the electroless plating methods, each aqueous-based "processing" solution, dispersion, or bath (for example, solutions containing electroless seed metal ions, reducing agent solutions, and solutions for electroless plating, as well as rinsing solutions) used at various points can be specifically designed with essential components as well as optional addenda that would be readily apparent to one skilled in the art. For example, one or more of those aqueous-based processing solutions can include such addenda as surfactants, anti-coagulants, anti-corrosion agents, anti-foamants, buffers, pH modifiers, biocides, fungicides, and preservatives. The aqueous-based reducing solutions can also include suitable antioxidants.

The method of this invention for forming a pattern in a polymeric layer, comprises:

providing a polymeric layer (as in forming the described precursor article), the polymeric layer comprising the reactive composition described above, comprising a reactive polymer as described above, and optionally a photosensitizer. This polymeric layer can be formed on a suitable substrate, if desired, as described above by suitable application of the reactive composition, after which the reactive composition is typically dried before the resulting precursor article is used in the method of this invention.

This polymeric layer in the precursor article, usually in dry form, can be then patternwise exposed to radiation having a $\lambda_{max}$ of at least 150 nm and up to and including 700 nm or to radiation having a $\lambda_{max}$ of at least 150 nm and up to and including 450 nm, to provide a polymeric layer comprising non-exposed regions and exposed regions comprising at least partially crosslinked polymer. This exposure can be provided with any suitable exposing source or device that provides the desired radiation including but not limited to, various arc lamps and LED sources. The particular exposing source can be chosen depending upon the absorption characteristics of the reactive composition used. The exposing radiation can be projected through lenses or a lens or mask element that can be in physical contact or in proximity with the outer surface of the polymeric layer. Exposure time can range from a fraction (0.1) of a second and up to and including 10 minutes depending upon the intensity of the radiation source and the reactive composition. Suitable masks can be obtained by known methods including but not limited to photolithographic methods, flexographic methods, or vacuum deposition of a chrome mask onto a suitable substrate such as quartz or high quality optical glass followed by photolithographic patterning.

It is optional but desirable to heat or bake the polymeric layer in the precursor article simultaneously with or after the patternwise exposure but generally before removing the reactive composition as described below, at a temperature sufficient to further crosslink the at least partially crosslinked exposed regions of the polymeric layer. In most embodiments, this heating is carried out at least after the patternwise exposure of the polymeric layer, but it can be carried out both during and after the patternwise exposure of the polymeric layer. The heating is generally at a temperature in the range of or exceeding the glass transition temperature of the polymeric layer [that is similar to or the same as the glass transition temperature of the reactive polymer]. Such heating can be accomplished on a hot plate with vacuum suction to hold the precursor article in close contact with the heating surface. Alternatively, the heating device can be a convection oven. The glass transition temperatures of the reactive polymers useful in the practice of this invention can generally range from at least 0° C. and up to and including 200° C. Thus, polymeric layer can be heated at a temperature of less than 200° C. particularly if a plasticizer is present in the reactive composition. The duration of the heating procedure is generally less than 10 minutes with heating for least 10 seconds and up to and including 5 minutes being most likely. After the heating procedure, a faint image may be observable in the exposed regions of the polymeric layer due to the change in the index of refraction or physical contraction or expansion of the chemically altered reactive polymer. The optimal heating time and temperature can be readily determined with routine experimentation depending upon the particular reactive composition.

This results in an intermediate article of this invention comprising a substrate and having disposed thereon a polymeric layer comprising exposed regions and non-exposed regions, the exposed regions comprising a pattern of at least partially crosslinked polymer that has been derived from a reactive polymer as described above, and the non-exposed regions comprising a reactive composition that comprises the reactive polymer as described above, and optionally, a photosensitizer.

The polymeric layer is generally hydrophilic in the crosslinked and exposed regions such that immersion in aqueous-based solutions (described below) will allow the aqueous molecules, ions, or reagent molecules to rapidly diffuse into the exposed regions.

After the imagewise exposure and optional heating procedures, the reactive composition comprising the reactive polymer can be removed from the non-exposed regions in the noted intermediate article so that there is essentially no (less than 20%, and preferably less than 10%, by weight of the original amount) reactive composition remaining on the substrate. This can be done by washing, spraying, or immersing the intermediate article in water or another aqueous solution for a suitable time and temperature to remove most or all of the reactive composition from the non-crosslinked, non-exposed regions of the polymeric layer. Contact with the aqueous solution can be carried out for a suitable time and temperature so that reactive composition is desirably removed in the non-exposed regions but little removal occurs in the exposed regions containing the crosslinked polymer. For example, the contact time can be at least 10 seconds and up to and including 10 minutes, and the contact temperature can be at room temperature (about 20° C.) and up to and including 95° C.

This procedure thus provides another intermediate article of this invention, comprising a substrate and having disposed thereon a polymeric layer comprising exposed regions and non-exposed regions, the exposed regions comprising a pattern of at least partially crosslinked polymer that has been derived from a reactive polymer in a reactive composition as defined above, and the non-exposed regions comprising none of the reactive polymer as described above.

Once reactive composition has been removed from the non-exposed regions, the exposed regions of the polymeric layer can be contacted with an aqueous-based solution or dispersion of electroless seed metal ions to form a pattern of electroless seed metal ions in the exposed regions of the polymeric layer. There are various ways that this contacting can be carried out. Typically, the entire intermediate article is immersed within a dilute aqueous-based solution, bath, or dispersion of the electroless seed metal ions for a sufficient time to coordinate the optimum number of electroless seed metal ions within the crosslinked polymer that has been derived from the reactive polymer described above. For example, this contact with the electroless seed metal ions can be carried out for at least 1 second and up to and including 30 minutes, at room temperature (about 20° C.) or at a higher temperature of up to and including 95° C. The time and temperature for this contact can be optimized for a given reactive composition and electroless seed metal ions that are to be used.

Representative electroless seed metal ions that can be used in these procedures are selected from the group consisting of silver ions, platinum ions, palladium ions, gold ions, tin ions, rhodium ions, iridium ions, nickel ions, and copper ions. Most noble metal ions can serve as electroless seed metal ions in the present invention. These electroless seed metal ions can be provided in the form of a suitable metal salt or metal-ligand complex (that can have an overall positive, negative, or neutral charge). Useful materials of this type include but are not limited to, metal salts and metal-ligand complexes of nitrates, halides, acetates, cyanides, thiocyanates, amines, nitriles, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can be optimized for a particular reactive composition and exposure procedure. For example, the metal salts or metal-ligand complexes can be present in the aqueous-based solution in an amount sufficient to provide at least 0.00001 molar and up to and including 2 molar of the desired electroless metal ions. In one embodiment, a 0.4 molar silver nitrate solution can be used at room temperature to provide electroless seed silver ions.

The contact with the electroless seed metal ions produces an intermediate article comprising a substrate and having disposed thereon a polymeric layer comprising exposed regions and non-exposed regions, the exposed regions comprising a pattern of electroless seed metal ions complexed within the at least partially crosslinked polymer derived from a reactive polymer in a reactive composition as described above, and the non-exposed regions comprising none of the electroless seed metal ions or the reactive polymer as described above.

After the requisite time to react the electroless seed metal ions within the at least partially crosslinked polymer in the exposed regions, the polymeric layer can be rinsed with distilled or deionized water or another aqueous-based solution for a suitable time and at a suitable temperature, for example usually room temperature or slightly higher.

After forming the pattern of electroless seed metal ions, the electroless seed metal ions can be reduced to provide a pattern of the corresponding electroless seed metal nuclei in the exposed regions of the polymeric layer. This can be done by contacting the polymeric layer (or at least the exposed regions) with a suitable reducing agent for the electroless seed metal ions. For example, the intermediate article comprising the polymeric layer can be immersed within an aqueous-based reducing solution containing one or more reducing agents for a suitable time to cause sufficient metal ion reduction. Alternatively, an aqueous-based reducing solution comprising the reducing agent can be sprayed or rolled uniformly onto the polymeric layer.

Useful reducing agents include but are not limited to, an organic borane, an aldehyde such as formaldehyde, aldehyde sugar, hydroquinone, or sugar (or polysaccharide) such as ascorbic acid, and metal ions such as tin(II). These reducing agents can be used individually or in combination, and the total amount in the aqueous-based reducing solution used for the reducing procedure can be at least 0.01 weight % and up to and including 20 weight % based on the total reducing solution weight. The amount of reducing agent to be used will depend upon the particular electroless seed metal ions and reducing agent to be used, and this can be readily optimized using routine experimentation. The time and temperature for the reduction can also be readily optimized in the same manner. Generally, the reducing temperature is at least room temperature (about 20° C.) and up to and including 95° C. and the reducing time can be for at least 1 second and up to and including 30 minutes.

For example, some embodiments of the present invention can be carried out using an immersion bath comprising 1 reducing solution weight % of an organic borane such as dimethylamine borane (DMAB) at room temperature for up to 3 minutes. Longer or shorter times at higher temperatures are possible if needed.

After this reducing procedure, the polymeric layer, especially the exposed regions, can be again washed using distilled water or deionized water or another aqueous-based solution at a suitable temperature for a suitable time.

At this point, the method of this invention has provided yet another intermediate article, comprising a substrate and having disposed thereon a polymeric layer comprising exposed regions and non-exposed regions, the exposed regions comprising a pattern of corresponding electroless seed metal nuclei within the at least partially crosslinked polymer that has been derived from the reactive polymer in the reactive composition described above, and the non-exposed regions comprising none of the electroless seed metal nuclei or the reactive polymer as described above.

This intermediate article can be immediately immersed in an aqueous-based electroless metal plating bath or solution, or the intermediate article can be stored with just the catalytic pattern comprising corresponding electroless seed metal nuclei for use at a later time.

The intermediate article can be contacted with an electroless plating metal that is the same as or different from the corresponding electroless seed metal nuclei. In most embodiments, the electroless plating metal is a different metal from the corresponding electroless seed metal nuclei.

Any metal that will likely electrolessly "plate" on the corresponding electroless seed metal nuclei can be used at this point, but in most embodiments, the electroless plating metal can be for example copper(II), silver(I), gold(IV), palladium (II), platinum(II), nickel(II), chromium(II), and combinations thereof. Copper(II), silver(I), and nickel(II) are particularly useful electroless plating metals.

The one or more electroless plating metals can be present in the aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure, the resulting product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of corresponding electroless seed metal nuclei that have been electrolessly plated with the same or different metal within the at least partially crosslinked polymer derived from the reactive polymer in the reactive composition as described above, and the non-exposed regions comprising none of the electrolessly plated metal or the reactive polymer as described above.

To change the surface of the electroless plated metal for visual or durability reasons, it is possible that a variety of post-treatments can be employed including surface plating of still at least another (third or more) metal such as nickel or silver on the electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, it may be desirable to treat the electrolessly plated metal with a seed metal catalyst in an aqueous-based seed metal catalyst solution to facilitate deposition of additional metals.

As one skilled in the art should appreciate, the individual treatments or steps described above for this method can be carried out two or more times before proceeding to the next procedure or step. For example, the treatment with the aqueous-based solution containing electroless seed metal ions can be carried out two or more times in sequence, for example, with a rinsing step between sequential treatments. The electroless seed metal ions can be the same or different for the sequential treatments and the treatment conditions can be the same or different.

In addition, multiple treatments with an aqueous-based reducing solution or aqueous-based electroless metal plating solution can be carried out in sequence using the same or different conditions. Sequential washing or rinsing steps can also be carried out where appropriate.

Further, the electroless plating procedures can be carried out multiple times, in sequence, using the same or different electroless plating metal and the same or different electroless plating conditions.

The reactive polymers and reactive compositions described above can also be used in additional patterning methods described as follows:

Electroless Plating Method 2:

This method can be used to form a pattern in a polymeric layer, the method comprising:

providing a polymeric layer comprising a reactive composition that comprises: (1) a reactive polymer, and (2) optionally, a photosensitizer, as described above, patternwise exposing the polymeric layer to radiation having a $\lambda_{max}$ of at least 150 nm that is sufficient to induce crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the exposed regions of the polymeric layer, removing the reactive composition comprising the reactive polymer in the non-exposed regions, incorporating a reducing agent into the exposed regions of the polymeric layer, contacting the exposed regions of the polymeric layer with electroless seed metal ions to oxidize the reducing agent in the exposed regions of the polymeric layer and to form a pattern of electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

The polymeric layer in a precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, as described above.

It is optional but desirable to heat or bake the reactive composition in the precursor article simultaneously with or after the patternwise exposure but generally before contacting the exposed polymeric layer with the aqueous-based reducing solution (described below) and conditions as described above.

Generally immediately after the patternwise exposing or optional heating procedures, the reactive composition in the non-exposed regions of the polymeric layer is removed as described above in prior methods. Upon this removal of reactive composition from the non-exposed regions of the polymeric layer, the various articles described herein will contain crosslinked polymer in the exposed regions of the polymeric layer.

At this point, an intermediate article has been created in which the exposed regions of the polymeric layer on the substrate comprise crosslinked polymer derived from the reactive polymer in the reactive composition as described herein, and the non-exposed regions of the polymeric layer comprise little or no reactive composition (less than 10 weight % of the original amount).

After the exposure, optional heating, and removal of the non-exposed regions of the polymeric layer, the exposed regions of the polymeric layer are contacted with an aqueous-based reducing solution containing one or more reducing agents and conditions, as described above. In the exposed regions, the reducing agent can diffuse into the crosslinked polymer provided during irradiation or the reactive composition described herein. In the non-exposed regions, the reducing agent does not readily diffuse into or attach to the substrate where the non-exposed reactive polymer (reactive composition) has been removed.

After this reducing procedure, the polymeric layer, especially the exposed regions, can be again washed using distilled water or deionized water or another aqueous-based solution at a suitable temperature for a suitable time.

At this point, an intermediate article is provided, which intermediate article comprises a substrate and having disposed thereon a polymeric layer comprising exposed regions and non-exposed regions, the exposed regions comprising a pattern of a crosslinked polymer derived from the reactive polymer in the reactive composition described herein, and comprising reducing agent dispersed within the crosslinked polymer, and the non-exposed regions comprising substantially no reactive composition.

Once the patternwise exposure, optional heating, removal of non-exposed reactive polymer (reactive composition), and contacting with the reducing agent have been carried out, the exposed regions of the polymeric layer can be contacted with an aqueous-based solution or dispersion of electroless seed metal ions to form electroless seed metal nuclei in the exposed regions of the polymeric layer using aqueous-based solutions and conditions as described above. These electroless seed metal nuclei form catalytic sites for electroless metal plating (deposition of metal) described below.

The contact with the electroless seed metal ions produces an intermediate article comprising a substrate and having disposed thereon a polymeric layer comprising exposed regions and non-exposed regions, the exposed regions comprising a pattern of electroless seed metal nuclei within the crosslinked polymer resulting from the irradiation of the reactive polymer in the reactive composition described herein, and the non-exposed regions comprising substantially no reactive composition.

After the requisite time to react within the resulting crosslinked polymer in the exposed regions, the polymeric layer can be rinsed with distilled or deionized water or other aqueous-based solution for a suitable time and at a suitable temperature, usually room temperature or slightly higher.

The resulting intermediate article can be immediately immersed in an aqueous-based electroless plating bath or solution or the immediate article can be stored with the catalytic pattern comprising corresponding electroless seed metal nuclei for use at a later time. The intermediate article can be contacted with an electroless plating metal that is the same as or different from the corresponding electroless seed metal nuclei, using aqueous-based solutions and conditions as described above.

After the electroless plating procedure, a product article is removed from the aqueous-based electroless plating bath and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of an electroless seed metal nuclei (for example, in a pattern) that have been electrolessly plated with the same or different metal, and crosslinked polymer resulting from irradiation of the reactive polymer in the reactive composition described above, and the non-exposed regions comprising substantially no reactive composition.

Electroless Plating Method 3:

This method can be used to form a pattern in a polymeric layer, the method comprising:

providing a polymeric layer comprising a reactive composition that comprises: (1) a reactive polymer, and (2) optionally, a photosensitizer, as described above, patternwise exposing the polymeric layer to radiation having a $\lambda_{max}$ of at least 150 nm that is sufficient to induce crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the exposed regions of the polymeric layer, removing the reactive composition comprising the reactive polymer in the non-exposed regions, contacting both the non-exposed regions and the exposed regions of the polymeric layer with a reducing agent, bleaching the polymeric layer to remove surface amounts of the reducing agent in both non-exposed and exposed regions of the polymeric layer, contacting the exposed regions of the polymeric layer with electroless seed metal ions to oxidize the reducing agent and to form a pattern of electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

Thus, in this method that includes providing a polymeric layer (as in forming the described precursor article), the polymeric layer comprises a reactive composition comprising a reactive polymer and optionally, a photosensitizer, all as described above.

This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, as described above.

It is optional but desirable to heat or bake the reactive composition in the precursor article simultaneously with or after the patternwise exposure but generally before contacting the exposed polymeric layer with electroless seed metal ions (described below), as described above.

Generally immediately after the patternwise exposing or optional heating procedures, the reactive composition remaining in the non-exposed regions of the polymeric layer is removed as described above in previous methods (at least 90 weight % of the original amount).

At this point, an intermediate article has been created in which the exposed regions of the polymeric layer on the substrate comprise crosslinked polymer derived from the reactive polymer in the reactive composition described above, and the non-exposed regions of the polymeric layer comprise little or no reactive composition.

After the exposure and optional heating, the exposed regions of the polymeric layer are contacted with an aqueous-based reducing solution containing one or more suitable reducing agents using aqueous-based solutions and conditions as described above. In the exposed regions, the reducing agent can diffuse into the crosslinked polymer. In the non-exposed regions, the reducing agent does not readily diffuse into the substrate or any residual polymeric layer but will become attached to the surface of the substrate or residual polymeric layer (reactive composition).

After this reducing procedure, the polymeric layer, especially the exposed regions, can be again washed using distilled water or deionized water or another aqueous-based solution at a suitable temperature for a suitable time.

At this point, an intermediate article is provided, which intermediate article comprises a substrate and having disposed thereon a polymeric layer comprising exposed regions and non-exposed regions, the exposed regions comprising a crosslinked polymer derived from the reactive polymer in the reactive composition described above, into which a reducing agent has diffused, and the non-exposed regions comprising substantially no reducing agent and reactive composition (less than 10 weight % of the original amount).

Once patternwise exposure, optional heating, removal of the non-exposed reactive polymer (reactive composition), and the reducing procedure have been carried out, the polymeric layer can be contacted with an aqueous-based bleaching (or oxidizing) solution comprising one or more bleaching agents, thereby removing surface amounts of the reducing agent in both non-exposed and exposed regions of the polymeric layer. The term "bleaching" refers to oxidizing the reducing agent molecules to make them inactive for further reaction (thus, they cannot reduce the seedless metal ions when bleached).

Useful bleaching agents for this bleaching procedure can be chosen depending upon the reducing agent that is used in the previous operation. Representative bleaching agents include but are not limited to, peroxides such as hydrogen peroxide, persulfates, iron(III) complexes, and combinations thereof. Hydrogen peroxide is particularly useful. In general, the one or more bleaching agents are present in the aqueous-based bleaching solution in an amount of at least 0.01 weight % and up to and including 20 weight %, based on total aqueous-based bleaching solution weight.

In general, bleaching the polymeric layer is carried out in sufficient time and temperature so that the aqueous-based bleaching solution reacts with (deactivates) or removes at least 90 mol % (or typically at least 95 mol %) of the reducing agent in the non-exposed regions and less than 40 mol (or typically less than 25 mol %) in the exposed regions of the polymeric layer. The useful time and temperature conditions needed to achieve these results would be readily determined with routine experimentation in view of the teaching provided herein.

At this point, the present invention provides an intermediate article, comprising a substrate and having disposed thereon a polymeric layer comprising exposed regions and non-exposed regions, the exposed regions comprising a pattern of non-oxidized reducing agent molecules within the crosslinked polymer resulting from the irradiation of the reactive polymer in the reactive composition described herein, and the non-exposed regions comprising substantially no reactive composition.

Once the previous operations have been carried out, the exposed regions of the polymeric layer can be contacted with an aqueous-based solution or dispersion containing electroless seed metal ions to oxidize the reducing agent and to form corresponding electroless seed metal nuclei (for example in a pattern) in the exposed regions of the polymeric layer using aqueous-based solutions and conditions as described above. These corresponding electroless seed metal nuclei form catalytic sites for electroless metal plating (deposition of metal) described below.

The contact with the electroless seed metal ions produces an intermediate article comprising a substrate and having disposed thereon a polymeric layer comprising exposed regions and non-exposed regions, the exposed regions comprising a pattern of corresponding electroless seed metal nuclei within the crosslinked polymer resulting from irradiation of the reactive polymer in the reactive composition described herein, and the non-exposed regions comprising substantially no reactive composition.

After the requisite time to react the electroless seed metal ions within the resulting crosslinked polymer in the exposed regions, the polymeric layer can be rinsed with distilled or deionized water or another aqueous-based solution for a suitable time and at a suitable temperature, usually room temperature or slightly higher.

The resulting intermediate article can be immediately immersed in an aqueous-based electroless plating bath or solution or it can be stored with just the catalytic pattern comprising electroless seed metal for use at a later time.

The article can be contacted with an electroless plating metal that is the same as or different from the electroless seed metal using aqueous-based solutions and conditions as described above. In most embodiments, the electroless plating metal is a metal different from the corresponding electroless seed metal nuclei.

After the electroless plating procedure, the product article is removed from the aqueous-based electroless plating bath and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of a corresponding electroless seed metal nuclei within the crosslinked polymer derived from the reactive polymer in the reactive composition described herein, which has been electrolessly plated with the same or different metal, and the non-exposed regions comprising substantially no reactive composition or electroless seed metal nuclei.

Electroless Plating Method 4:

This method can be used to form a pattern in a polymeric layer, the method comprising:

providing a polymeric layer comprising a reactive composition that comprises: (1) a reactive polymer, and (2) optionally, a photosensitizer, as described above, patternwise exposing the polymeric layer to radiation having a $\lambda_{max}$ of at least 150 nm that is sufficient to induce crosslinking within the reactive polymer, to provide a polymeric layer comprising non-exposed regions and first exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the first exposed regions of the polymeric layer, removing the reactive composition comprising the reactive polymer in the non-exposed regions (at least 90 weight % of the original amount), contacting the first exposed regions of the polymeric layer with electroless seed metal ions to form electroless seed metal ions in the first exposed regions of the polymeric layer, contacting the first exposed regions of the polymeric layer with a halide to react with the electroless seed metal ions and to form corresponding electroless seed metal halide in the first exposed regions of the polymeric layer, optionally exposing the polymeric layer to convert at least some of the corresponding electroless seed metal halide in the first exposed regions to corresponding electroless seed metal nuclei and to form second exposed regions in the polymeric layer, optionally contacting the polymeric layer with a reducing agent either: (i) to develop the corresponding electroless seed metal image in the second exposed regions of the polymeric layer, or (ii) to develop all of the corresponding electroless seed metal halide in the first exposed regions, optionally contacting the polymeric layer with a fixing agent to remove any remaining corresponding electroless seed metal halide in either the first exposed regions, the second exposed regions, or both of the first exposed regions and the second exposed regions, and electrolessly plating the corresponding electroless seed metal nuclei in the first exposed regions, the second exposed regions, or both the first exposed regions and the second exposed regions, of the polymeric layer with a metal that is the same as or different from the corresponding electroless seed metal nuclei.

Such method is carried out by providing a polymeric layer (as in forming the described precursor article), the polymeric layer comprising the reactive composition described above. This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, as described above to provide a polymeric layer comprising non-exposed regions and first exposed regions comprising a crosslinked polymer.

It is optional but desirable to heat or bake the reactive composition in the precursor article simultaneously with or after the patternwise exposure but generally before removal of the non-exposed reactive polymer (reactive composition), and contacting the exposed polymeric layer with electroless seed metal ions (described below), as described above.

Generally immediately after the patternwise exposing or optional heating procedures, the reactive composition remaining in the non-exposed regions of the polymeric layer is removed as described above for other methods (at least 90 weight % of the original amount). Upon this removal of reactive composition from the non-exposed regions of the polymeric layer, the various articles described herein will contain crosslinked polymer in the exposed regions of the polymeric layer.

At this point, an intermediate article has been created in which the first exposed regions of the polymeric layer on the substrate comprise crosslinked polymer derived from the reactive polymer in the reactive composition described above, and the non-exposed regions of the polymeric layer comprise substantially no reactive composition.

Once patternwise exposure and optional heating have been carried out, the first exposed regions of the polymeric layer are contacted with water or an aqueous-based solution to remove the non-exposed reactive polymer (reactive composition), then with electroless seed metal ions to form coordinated electroless seed metal ions in the first exposed regions of the polymeric layer using aqueous-based solutions and conditions described above.

The contact with the electroless seed metal ions produces an intermediate article comprising a substrate and having disposed thereon a polymeric layer comprising first exposed regions and non-exposed regions, the first exposed regions comprising a pattern of electroless seed metal ions within the crosslinked polymer resulting from irradiation of the reactive polymer in the reactive composition described above, and the non-exposed regions comprising substantially no reactive composition.

After the requisite time to react the electroless seed metal ions within the crosslinked polymer in the first exposed regions, the polymeric layer can be rinsed with distilled or deionized water or another aqueous-based solution for a suitable time and at a suitable temperature, usually room temperature or slightly higher.

At least the first exposed regions of the polymeric layer are then contacted with a halide that reacts with the seed metal ions to form corresponding electroless seed metal halide in the first exposed regions of the polymeric layer. Halides can be provided as suitable halide salts to provide iodide ions, chloride ions, or bromide ions or a combination of two or more of these halides to form electroless seed metal halide in the first exposed regions of the polymeric layer. Chloride ions, iodide ions, or bromide ions or mixtures thereof are particularly useful.

This contacting with a halide can be carried out by immersing the intermediate article described above within an aqueous-based halide bath or halide solution of a suitable halide salt, or the aqueous-based halide solution can be sprayed or coated onto the polymeric layer in a uniform or patternwise manner. The time for this halide treatment can be at least 1 second and up to and including 30 minutes, and the temperature for the halide treatment can be room temperature (about 20° C.) and up to and including 95° C. The time and temperature and the type and amount of halide in a treatment bath can be optimized in order to provide the sufficient amount of corresponding electroless seed metal halide in the first exposed regions of the polymeric layer.

At this point, an intermediate article has been created, which intermediate article comprises a substrate and having thereon a polymeric layer comprising first exposed regions and non-exposed regions, the first exposed regions of the polymeric layer comprising a pattern of corresponding electroless seed metal halide in the crosslinked polymer derived from the reactive polymer in the reactive composition described above, and the non-exposed regions comprising substantially no reactive composition.

After this halide treatment, the polymeric layer can be optionally exposed again to convert at least some, or typically at least 20% (or more typically at least 50%), of the corresponding electroless seed metal halide in first exposed regions of the polymeric layer to corresponding electroless seed metal nuclei using radiation having a $\lambda_{max}$ of at least 150 nm and up to and including 450 nm, or more likely having a $\lambda_{max}$ of at least 240 nm and up to and including 450 nm. The second exposed regions can be the same as or different from the first exposed regions, or the first and second exposed regions can partially overlap.

With this second exposure, the method can provide yet another intermediate article comprising a substrate and having disposed thereon a polymeric layer comprising first exposed regions, second exposed regions, and non-exposed regions, the first exposed regions comprising corresponding electroless seed metal halide in the crosslinked polymer derived from the reactive polymer in the reactive composition described above, the second exposed regions comprising a pattern of corresponding electroless seed metal halide with a latent image in the crosslinked polymer derived from the reactive polymer in the reactive composition described above, and the non-exposed regions comprising substantially no reactive composition as described above.

The polymeric layer comprising corresponding electroless seed metal halide in the first exposed regions, or corresponding electroless seed metal latent image in the second exposed regions, or both corresponding electroless seed metal halide in the first exposed regions and corresponding electroless seed metal latent image in the second exposed regions are then optionally contacted with a suitable aqueous-based reducing solution comprising one or more reducing agents using aqueous-based solutions and conditions as described above.

After this reducing procedure, the polymeric layer, especially the first exposed regions or the second exposed regions, can be again washed using distilled water or deionized water or another aqueous-based solution for a suitable time to remove excess reducing agent.

The reducing procedure can provide another intermediate article that comprises a substrate and having thereon a polymeric layer comprising first exposed regions, second exposed regions, and non-exposed regions, the first exposed regions of the polymeric layer comprising a pattern of corresponding electroless seed metal halide in a crosslinked polymer derived from the reactive polymer in the reactive composition described above, the second exposed regions of the polymeric layer comprising a pattern of corresponding electroless seed metal nuclei in the crosslinked polymer derived from the reactive polymer in the reactive composition described above, and the non-exposed regions of the polymeric layer comprising substantially no reactive composition.

The polymeric layer comprising corresponding electroless seed metal halide in the first exposed regions, or corresponding electroless seed metal nuclei in the second exposed regions, or both corresponding electroless seed metal halide in the first exposed regions and corresponding electroless seed metal nuclei in the second exposed regions, are then optionally contacted with a suitable fixing agent. This contact removes any remaining corresponding electroless seed metal halide from both the first exposed regions and the second exposed regions of the polymeric layer, while leaving behind any corresponding electroless seed metal nuclei in the second exposed regions.

This contact with a fixing agent can be done by immersing the polymeric layer (or at least the first and second exposed regions) within an aqueous-based fixing solution containing one or more fixing agents for a suitable time to cause the desired change (removal of the corresponding electroless metal halide) in the first exposed regions and the second exposed regions. Alternatively, an aqueous-based fixing solution can be sprayed or rolled uniformly onto the polymeric layer to accomplish the same results.

Useful fixing agents include but are not limited to, sulfites, thiocyanates, thiosulfates, thioureas, halides, ammonia, chelates such as ethylenediaminetetracetic acid, and mixtures thereof. Fixing accelerators can also be included in the aqueous-based fixing solutions, which compounds include, but are not limited to, thioethers and mercaptotriazoles. The fixing agents can be present as salts (that is alkali metal or ammonium salts) as is well known in the art, for instance as described in *Research Disclosure* December 1978 publication 38957. The total amount of fixing agents in the aqueous-based fixing solution can be at least 0.01 weight % and up to and including 50 weight % based on total fixing solution weight. The fixing agent amount can be readily optimized using routine experimentation. The fixing time and temperature can also be readily optimized in the same manner. Generally, the fixing temperature is at least room temperature (about 20° C.) and up to and including 99° C. and the reducing time can be for at least 1 second and up to and including 30 minutes.

For example, some embodiments of the present invention can be carried out using an aqueous-based fixing solution comprising 20 solution weight % of sodium thiosulfate in combination with 1.5 solution weight % of sodium sulfite at room temperature for 3 minutes. Longer or shorter times at higher temperatures are possible.

After this fixing procedure, the polymeric layer, especially the first exposed regions or the second exposed regions, can be again washed using distilled water or deionized water or another aqueous-based solution for a suitable time to remove excess fixing agent.

The fixing procedure can provide another intermediate article that comprises a substrate and having thereon a polymeric layer comprising first exposed regions, second exposed regions, and non-exposed regions, the first exposed regions of the polymeric layer from which the pattern of corresponding electroless seed metal halide has been removed, the first exposed regions comprising the crosslinked polymer being derived from a reactive polymer in a reactive composition as described above, the second exposed regions of the polymeric layer comprising a pattern of corresponding electroless seed metal nuclei in the crosslinked polymer being derived from a reactive polymer in a reactive composition as described above, and the non-exposed regions of the polymeric layer comprising substantially no reactive composition.

The intermediate article that has been treated as described above can be immediately immersed in an aqueous-based electroless metal plating bath or solution using conditions and aqueous-based solutions described above, or the treated article can be stored with just the catalytic pattern comprising corresponding electroless seed metal nuclei for use at a later time.

After the electroless plating procedure, the product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising first exposed regions (and optional second exposed regions) and non-exposed regions, the first or second exposed regions comprising a pattern of corresponding electroless seed metal nuclei that have been electrolessly plated with the same or different metal in a crosslinked polymer derived from the a reactive polymer in the reactive composition described herein, and the non-exposed regions comprising substantially no reactive composition.

Electroless Plating Method 5:

This method can be used to form a pattern in a polymeric layer, the method comprising:

providing a polymeric layer comprising a reactive composition that comprises: (1) a reactive polymer, and (2) optionally, a photosensitizer, as described above, patternwise exposing the polymeric layer to radiation having a $\lambda_{max}$ of at least 150 nm that is sufficient to induce crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the exposed regions of the polymeric layer, removing the reactive composition comprising the reactive polymer in the non-exposed regions (at least 90 weight % of the original amount), contacting the exposed regions of the polymeric layer with electroless seed metal ions to form a pattern of electroless seed metal ions in the exposed regions of the polymeric layer, optionally contacting the pattern of electroless seed metal ions in the exposed regions of the polymeric layer with a non-reducing reagent that reacts with the electroless seed metal ions to form an electroless seed metal compound that has a $K_{sp}$ of less than 40, and electrolessly plating the electroless seed metal compound within the exposed regions of the polymeric layer with a metal that is the same as or different from the corresponding electroless seed metal compound.

Such method thus comprises providing a polymeric layer (as in forming the described precursor article), the polymeric layer comprising a reactive composition as described above comprising a reactive polymer and optionally, a photosensitizer.

This polymeric layer in the precursor article, usually in dry form, can be then patternwise exposed as described above to radiation having a $\lambda_{max}$ of at least 150 nm and up to and including 450 nm or to radiation having a $\lambda_{max}$ of at least 150 nm and up to and including 330 nm, to provide a polymeric layer comprising non-exposed regions and exposed regions comprising a crosslinked polymer.

It is optional but desirable to heat or bake the polymeric layer in the precursor article simultaneously with or after the patternwise exposure but generally before contacting the polymeric layer with water or a suitable aqueous solution to remove the reactive polymer (reactive composition) in the non-exposed regions of the polymeric layer, and contacting the exposed polymeric layer with electroless seed metal ions (described below) using conditions described above.

Generally, immediately after the patternwise exposing or optional heating procedures, the reactive composition remaining in the non-exposed regions of the polymeric layer is removed as described above for previous methods.

At this point, an intermediate article has been created in which the exposed regions of the polymeric layer on the substrate comprise crosslinked polymer derived from the reactive polymer in the reactive composition described above, and the non-exposed regions of the polymeric layer comprise substantially no reactive composition.

Then, the exposed regions of the polymeric layer are contacted with electroless seed metal ions to form coordinated electroless seed metal ions in the exposed regions of the polymeric layer using aqueous-based solutions and conditions as described above.

The contact with the electroless seed metal ions produces an intermediate article comprising a substrate and having disposed thereon a polymeric layer comprising exposed regions and non-exposed regions, the exposed regions comprising a pattern of electroless seed metal ions within the crosslinked polymer resulting from the irradiation of the reactive polymer in the reactive composition described herein, and the non-exposed regions comprise substantially no reactive composition.

After the requisite time to react the electroless seed metal ions within the crosslinked polymer in the exposed regions, the polymeric layer can be rinsed with distilled or deionized water or another aqueous-based solution for a suitable time and at a suitable temperature, for example usually room temperature or slightly higher.

The electroless seed metal ions in the exposed regions of the polymeric layer are then contacted with a non-reducing reagent that reacts with the electroless seed metal ions to form an electroless seed metal compound (containing the non-reducing reagent) deposited within the exposed regions of the polymeric layer containing the crosslinked polymer derived from the reactive polymer in the reactive composition described above.

Useful non-reducing reagents include any compound that will covalently, ionically, or otherwise bond to or react with the electroless seed metal ions to form the electroless seed metal compound. Useful non-reducing reagents include those that provide electroless seed metal compounds having a $pK_{sp}$ value of less than 40, and for example, a $pK_{sp}$ that is greater than 4 and less than 40. For example, such useful non-reducing reagents include but are not limited to, alkali metal and ammonium hydroxides, thiosulfates, thiocyanates, sulfites, small organic acids, and combinations thereof. Halides are also useful non-reducing reagents for this invention. Alkali metal hydroxides are particularly useful including mixtures thereof.

This contacting procedure can be carried out in various ways including immersing the intermediate article in an aqueous-based non-reducing solution comprising one or more non-reducing reagents at a concentration of at least 1 weight % based on total aqueous-based non-reducing solution weight. Alternatively, an aqueous-based non-reducing solution can be sprayed or coated onto the polymeric layer in the intermediate article. The time and temperature for this contacting would be readily apparent to one skilled in the art in order to best achieve the desired bonding. For example, the contacting can be carried out at room temperature (about 20° C.) and up to and including 95° C. and the time can be for at least 1 second and up to and including 30 minutes.

After this contact with the non-reducing reagent, the polymeric layer, especially the exposed regions, can be again washed using distilled water or deionized water or another aqueous-based solution under suitable conditions of time and temperature.

At this stage, another intermediate article has been created, which intermediate article comprises a substrate and having disposed thereon a polymeric layer comprising exposed regions and non-exposed regions, the exposed regions of the polymeric layer comprising a pattern of an electroless seed metal compound (comprising a non-reducing reagent as described above) and a crosslinked polymer derived from the reactive polymer in the reactive composition described above, wherein the electroless seed metal compound has a $pK_{sp}$ of less than 40, and the non-exposed regions comprise substantially no reactive composition.

This intermediate article can be immediately immersed in an aqueous-based electroless metal plating bath or solution, or the intermediate article can be stored with just the catalytic pattern comprising electroless seed metal compound for use at a later time.

The intermediate article can be contacted with an electroless plating metal that is the same as or different from the metal within the electroless seed metal compound using the aqueous-based solutions and conditions described above. In most embodiments, the electroless plating metal is a different metal from the metal within the electroless seed metal compound.

After the electroless plating procedure, the product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of an electroless seed metal compound (comprising a non-reducing reagent as described above) which has been electrolessly plated with the same or different metal that is part of the electroless seed metal compound within a crosslinked polymer derived from the reactive polymer in the reactive composition described above, and the non-exposed regions comprising substantially no reactive composition.

The present invention provides at least the following embodiments and combinations thereof, but other combinations of features are considered to be within the present invention as a skilled artisan would appreciate from the teaching of this disclosure:

1. A method of forming a pattern in a polymeric layer, the method comprising:

providing a polymeric layer comprising a reactive composition comprising a non-crosslinked thiosulfate copolymer comprising, in any order: (a) recurring units comprising pendant thiosulfate groups, and (b) recurring units comprising pendant carboxy, carboxylate, phospho, phosphonate, phosphate, sulfo, sulfonate, or sulfite groups, wherein the (a) recurring units are present in an amount of at least 1 mol % and up to and including 30 mol %, and the (b) recurring units are present in an amount of at least 70 mol % and up to and including 99 mol %, both based on total recurring units in the non-crosslinked thiosulfate copolymer, patternwise exposing the polymeric layer to radiation having a $\lambda_{max}$ of at least 150 nm that is sufficient to induce crosslinking within the non-crosslinked thiosulfate copolymer, to provide a polymeric layer comprising non-exposed regions and exposed regions comprising a crosslinked polymer derived from the non-crosslinked thiosulfate copolymer, optionally heating the polymeric layer simultaneously with or after patternwise exposing the polymeric layer but before removing the reactive composition comprising the non-crosslinked thiosulfate copolymer in the non-exposed regions, at a temperature sufficient to further crosslink the crosslinked polymer in the exposed regions of the polymeric layer, removing the reactive composition comprising the non-crosslinked thiosulfate copolymer in the non-exposed regions, contacting the exposed regions of the polymeric layer comprising crosslinked polymer with electroless seed metal ions to form a pattern of electroless seed metal ions in the exposed regions of the polymeric layer, reducing the pattern of electroless seed metal ions to provide a pattern of corresponding electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

2. The method of embodiment 1, wherein the reactive composition further comprises a photosensitizer in an amount of at least 1 weight %, which photosensitizer provides sensitization at a $\lambda_{max}$ of at least 150 nm and up to and including 700 nm.

3. The method of embodiment 1 or 2, wherein the non-crosslinked thiosulfate copolymer comprises (a) recurring units in an amount of at least 5 mol % and up to and including 20 mol %, and (b) recurring units in an amount of at least 70 mol % and up to and including 95 mol %, all based on the total recurring units in the non-crosslinked thiosulfate copolymer.

4. The method of any of embodiments 1 to 3, wherein the non-crosslinked thiosulfate copolymer comprises (b) recurring units that comprise pendant carboxylic acid, carboxylate, sulfonic acid, or sulfonate groups.

5. The method of any of embodiments 1 to 4, wherein the non-crosslinked thiosulfate copolymer further comprises one or more additional (c) recurring units that are different from all (a) and (b) recurring units, the one or more additional (c) recurring units being present in an amount of up to and including 30 mol %, based on the total recurring units in the non-crosslinked thiosulfate copolymer.

6. The method of any of embodiments 1 to 5, further comprising:

heating the polymeric layer after patternwise exposing the polymeric layer but before removing the non-crosslinked thiosulfate copolymer in the non-exposed regions, at a temperature sufficient to further crosslink the crosslinked polymer in the exposed regions of the polymeric layer.

7. The method of any of embodiments 1 to 6, comprising contacting the exposed regions in the polymeric layer with electroless seed metal ions selected from the groups consisting of silver ions, platinum ions, palladium ions, gold ions, rhodium ions, nickel ions, iridium ions, tin ions, and copper ions.

8. The method of any of embodiments 1 to 7, comprising electrolessly plating with a metal that is selected from the group consisting of copper(II), silver(I), gold(IV), palladium (II), platinum(II), nickel(II), chromium(II), and combinations thereof.

9. The method of any of embodiments 1 to 8, comprising patternwise exposing the polymeric layer to radiation having a $\lambda_{max}$ of at least 150 nm and up to and including 450 nm.

10. The method of any of embodiments 1 to 9, comprising reducing the electroless seed metal ions in the exposed regions of the polymeric layer with a reducing agent that is a borane, aldehyde, hydroquinone, or sugar reducing agent.

11. A precursor article used in any of embodiments 1 to 10, the precursor article comprising a substrate and having disposed thereon a polymeric layer comprising a reactive composition that comprises:

a non-crosslinked thiosulfate copolymer comprising, in any order: (a) recurring units comprising pendant thiosulfate groups, and (b) recurring units comprising pendant carboxy, carboxylate, phospho, phosphonate, phosphate, sulfo, sulfonate, or sulfite groups, wherein the (a) recurring units are present in an amount of at least 1 mol % and up to and including 30 mol %, and the (b) recurring units are present in an amount of at least 70 mol % and up to and including 99 mol %, both based on total recurring units in the non-crosslinked thiosulfate copolymer, and optionally, a photosensitizer.

12. A product article provided by any of embodiments 1 to 10, the product article comprising a substrate and having disposed thereon a polymeric layer comprising exposed regions and non-exposed regions, the exposed regions comprising a pattern of electrolessly plated metal within or deposited on the surface of an at least partially crosslinked polymer that has been derived from a non-crosslinked thiosulfate copolymer comprising, in any order: (a) recurring units comprising pendant thiosulfate groups, and (b) recurring units comprising pendant carboxy, carboxylate, phospho, phosphonate, phosphate, sulfo, sulfonate, or sulfite groups, wherein the (a) recurring units are present in an amount of at least 1 mol % and up to and including 30 mol %, and the (b) recurring units are present in an amount of at least 70 mol % and up to and including 99 mol %, both based on total recurring units in the non-crosslinked thiosulfate copolymer, and the non-exposed regions comprising none of the electrolessly plated metal or the non-crosslinked thiosulfate polymer.

The following Examples are provided to illustrate the practice of this invention and are not meant to be limiting in any manner.

Preparation of Reactive Polymer A1:

A copolymer derived from methacrylic acid and p-chlorobenzyl styrene was prepared using a nominal 80:20 molar ratio of these monomers, by free radical polymerization in dimethyl formamide (DMF). A water solution of sodium thiosulfate was added to the polymer solution to replace the pendant chloro with pendant thiosulfate. The resulting reactive Polymer A1 was diluted with water and dialyzed to remove salts and DMF and then concentrated to 7.4 weight % solids.

Preparation of Reactive Polymer A2:

A copolymer derived from 80 mol % of methacrylic acid and 20 mol % of p-chlorobenzyl styrene was prepared by free radical polymerization in tetrahydrofuran (THF). The isolated polymer was dissolved in dimethyl formamide (DMF) and a water solution of sodium thiosulfate was added to replace the chloro functionality with thiosulfate. The resulting reactive Polymer A2 solution was diluted with water and dialyzed to remove salts and DMF and then concentrated to 7.1 weight % solids.

Preparation of Reactive Polymer B:

A copolymer derived from 90 mol % of methacrylic acid and 10 mol % of p-chlorobenzyl styrene was prepared by free radical polymerization in tetrahydrofuran (THF). The isolated polymer was dissolved in dimethyl formamide (DMF) and a water solution of sodium thiosulfate was added to replace the chloro functionality with thiosulfate. The resulting reactive Polymer B solution was diluted with water and dialyzed to remove salts and DMF then concentrated to 9.1 weight % solids.

Preparation of Reactive Polymer C:

A copolymer derived from 80 mol % of 4-sulfostyrene sodium salt and 20 mol % of p-sodium thiosulfate benzyl styrene was prepared by first replacing the chloro functionality on the p-chlorobenzyl styrene with thiosulfate in a water/methanol mixture. Then, the sodium 4-styrenesulfonate was added to this mixture and the reactive polymer was prepared by free radical polymerization. The resulting reactive Polymer C was diluted with water and dialyzed to remove salts and methanol then concentrated to 8.3 weight % solids.

Preparation of Reactive Polymer D:

A copolymer derived from 80 mol % of 4-sulfostyrene sodium salt and 20 mol % of p-chlorobenzyl styrene was prepared by free radical polymerization in dimethyl formamide (DMF). A water solution of sodium thiosulfate was added to replace the chloro functionality with thiosulfate. The resulting reactive Polymer D was diluted with water and dialyzed to remove salts and DMF then concentrated to 11.6 weight % solids.

Preparation of Reactive Polymer E:

A copolymer derived from 70 mol % methacrylic acid and 30 mol % p-chlorobenzyl styrene was prepared by free radical polymerization in tetrahydrofuran (THF). The isolated polymer was dissolved in dimethyl formamide (DMF) and a water solution of sodium thiosulfate was added to replace the chloro functionality with thiosulfate. The resulting reactive Polymer E was diluted with water and dialyzed to remove salts and DMF then concentrated to 10.2 weight % solids.

Preparation of Reactive Polymer F:

A copolymer derived from 60 mol % of methacrylic acid and 40 mol % of p-chlorobenzyl styrene was prepared by free radical polymerization in tetrahydrofuran (THF). The isolated polymer was dissolved in dimethyl formamide (DMF) and a water solution of sodium thiosulfate was added to replace the chloro functionality with thiosulfate. The resulting reactive Polymer F was diluted with water and dialyzed to remove salts and DMF then concentrated to 10.2 weight % solids.

Preparation of Reactive Polymer G:

A copolymer derived from 50 mol % of methacrylic acid and 50 mol % of p-chlorobenzyl styrene was prepared by free radical polymerization in tetrahydrofuran (THF). The isolated polymer was dissolved in dimethyl formamide (DMF) and a water solution of sodium thiosulfate was added to replace the chloro functionality with thiosulfate. The resulting reactive Polymer G was diluted with water and dialyzed to remove salts and DMF then concentrated to 11.4 weight % solids.

Preparation of Reactive Polymer H:

A copolymer derived from 80 mol % of 2-acrylamido-2-methylpropane sulfonic acid and 20 mol % of p-chlorobenzyl styrene was prepared by free radical polymerization in dimethyl formamide (DMF). A water solution of sodium thiosulfate was added to replace the chloro functionality with thiosulfate. The resulting reactive Polymer H was diluted with water and dialyzed to remove salts and DMF then concentrated to 9.9 weight % solids.

Preparation of Reactive Polymer I:

A copolymer derived from 70 mol % of methyl methacrylate and 30 mol % of p-chlorobenzyl styrene was prepared by free radical polymerization in tetrahydrofuran (THF). The isolated polymer was dissolved in dimethyl formamide (DMF) and a water solution of sodium thiosulfate was added to replace the chloro functionality with thiosulfate. The resulting reactive Polymer I was diluted with water and dialyzed to remove salts and DMF then concentrated to 8.3 weight % solids.

Preparation of the Electroless Copper Plating Bath:

The following components were dissolved in a glass container that was cleaned with concentrated nitric acid followed by a thorough rinse with distilled water to eliminate any trace of metal on the glass: 1.8 g of copper(II) sulfate pentahydrate, 6.25 g of tetrasodium EDTA (ethylenediaminetetraacetic acid)tetrahydrate, 0.005 g of potassium ferrocyanide trihydrate, 2.25 g of 37 weight % formaldehyde solution, 80 g of distilled water, and 2 to 3 g of 45 weight % sodium hydroxide solution to adjust the pH to 12.8.

Reactive Compositions, Preparation of Polymeric Layers in Articles, and Patterning with Copper:

The 7.0 weight % aqueous solution of Polymer A1 described above, and containing 0.05 weight % of Dupont Capstone FS-35 surfactant was spin coated at 1200 RPM as a reactive composition onto a substrate composed of a PET (polyethylene terephthalate) film having thereon a polymeric adhesion layer of a latex copolymer derived from glycidyl methacrylate and butyl acrylate.

Samples of the resulting precursor article were imagewise exposed to broadband ultraviolet light through a chrome-on-quartz contact mask for various times as shown below in TABLE I. One sample at each exposure time was contacted with a vacuum hotplate at 120° C. for 60 seconds while another sample at each exposure time was cured at room temperature (RT) to form imaged and cured intermediate articles.

Following the room temperature or the vacuum hotplate curing time, each intermediate film was then immersed in well agitated distilled water for 2 minutes to remove the reactive composition (reactive Polymer A1) in the non-exposed regions from the substrate. All washed intermediate articles were then immersed in a 0.4 molar silver nitrate solution for 1 minute, rinsed in distilled water, immersed in a 1 weight % reducing agent dimethylamine borane (DMAB) bath for 30 seconds, followed by another distilled water rinsing. The resulting intermediate articles were then immersed in the electroless copper plating bath described above for up to 15 minutes. A continuous conductive copper pattern was formed in all exposed regions of the polymeric layer, the copper patterns having average line widths of 5 to 6 μm diameter were faithfully reproduced for the some of the samples as described below in TABLE I.

Reactive Compositions Containing Long UV Spectral Photosensitizer:

Two reactive composition solutions containing Polymer A1 were prepared as described above except that the long UV spectral photosensitizer 3-(4-phenyl-1-pyridinio)-1-propane sulfonate was added at an amount of either 0.4 weight % and 0.8 weight % (with respect to the total solution weight). The exposing and processing conditions along with the electroless copper plating bath were carried out similarly as described above, and the conditions and results are also described below in TABLE I.

Comparative Examples 1 and 2 were carried out using reactive compositions similar to those described above but that did not comprise a photosensitizer.

TABLE I

| Example | Long UV Spectral photosensitizer (weight %) | Exposure time (seconds) | Curing conditions | Deionized water time (min) | Silver Nitrate Bath Time (seconds) | DMAB Time (seconds) | Electroless Copper Plating Time (minutes) | Copper Plating Quality |
|---|---|---|---|---|---|---|---|---|
| Comparative 1 | None | 60 | 1 hour at RT* | 2 | 60 | 30 | 5 | none |
| Comparative 2 | None | 60 | 1 minute at 120° C. | 2 | 60 | 30 | 5 | none |
| Invention 1 | None | 120 | 1 hour at RT | 2 | 60 | 30 | 5 | fair |
| Invention 2 | None | 120 | 1 minute at 120° C. | 2 | 60 | 30 | 5 | good |
| Invention 3 | None | 240 | 1 hour at RT | 2 | 60 | 30 | 5 | fair |
| Invention 4 | None | 240 | 1 minute at 120° C. | 2 | 60 | 30 | 5 | good |
| Invention 5 | None | 240 | 1 minute at 120° C. | 2 | 60 | 30 | 10 | very good |
| Invention 6 | none | 240 | 1 minute at 120° C. | 2 | 60 | 30 | 15 | excellent |
| Invention 7 | none | 480 | 1 hour at RT | 2 | 60 | 30 | 5 | Fair |
| Invention 8 | none | 480 | 1 minute at 120° C. | 2 | 60 | 30 | 5 | good |
| Invention 9 | none | 480 | 1 minute at 120° C. | 2 | 60 | 30 | 10 | excellent |
| Invention 10 | none | 480 | 2 minutes at 120° C. | 2 | 60 | 30 | 15 | excellent |
| Invention 11 | none | 960 | 1 minute at 120° C. | 2 | 60 | 30 | 15 | excellent |
| Invention 12 | 0.4 | 60 | 1 minute at 120° C. | 2 | 60 | 30 | 15 | excellent |
| Invention 13 | 0.4 | 30 | 1 minute at 120° C. | 2 | 60 | 30 | 15 | Very good |
| Invention 14 | 0.4 | 15 | 1 minute at 120° C. | 2 | 60 | 30 | 15 | fair |
| Invention 15 | 0.8 | 60 | 1 minute at 120° C. | 2 | 60 | 30 | 15 | excellent |
| Invention 16 | 0.8 | 30 | 1 minute at 120° C. | 2 | 60 | 30 | 15 | excellent |
| Invention 17 | 0.8 | 15 | 1 minute at 120° C. | 2 | 60 | 30 | 15 | excellent |

*RT is room temperature at about 20° C.

The data (Invention Examples 1-11) in TABLE I show that in the absence of the long UV spectral photosensitizer, electroless copper plating of a high resolution pattern can be obtained using exposure times of 120 seconds or longer, and especially with electroless plating times greater than 10 minutes. When the long UV spectral photosensitizer 3-(4-phenyl-1-pyridinio)-1-propane sulfonate was added to the reactive composition (Invention Examples 12-17) at amounts as low as 0.4 weight % in the reactive compositions, the requisite exposure times needed to obtain excellent copper plated patterns were reduced to as low as 15 seconds, thereby demonstrating a large increase in overall sensitivity of the reactive compositions.

Comparative Example 3 and Invention Example 18

A 7.09 weight % solution (9.17 g) of reactive Polymer A2, 0.2 g of a 2.5 weight % solution of Dupont Capstone FS-35 surfactant, and 0.63 g of distilled water were added to a 10 g sample container, mixed, and then spin coated at 1200 RPM onto PET (polyethylene terephthalate) film having a polymeric adhesion layer of copolymers derived from glycidyl methacrylate and butyl acrylate that had been applied before stretching as previously described to form precursor articles.

Invention Examples 19 and 20

A 7.09 weight % solution (9.17 g) of reactive Polymer A2, 0.2 g of a 2.5 weight % solution of Dupont Capstone FS-35 surfactant, 0.075 g of photosensitizer BSS1 (shown below), and 0.56 g of distilled water were added to a 10 g sample container, mixed, and then spin coated at 1200 RPM onto the same substrate as Invention Example 18 to form precursor articles.

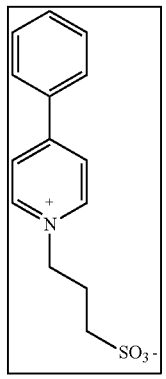

Photosensitizer BSS1

Invention Examples 21 and 22

A 7.09 weight % solution (9.17 g) of reactive Polymer A2, 0.2 g of a 2.5 weight % solution of Dupont Capstone FS-35 surfactant, 0.078 g of sensitizer BSS2 (shown below), and 0.55 g of distilled water were added to a 10 g sample container, mixed, and then spin coated at 1200 RPM onto the same substrate as in Invention Example 18 to form precursor articles.

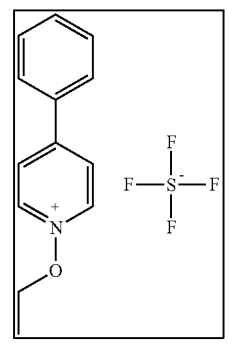

Photosensitizer BSS2

Samples of the precursor articles described above were exposed to 220-260 nm ultraviolet light through a chrome-on-quartz contact mask for various times as shown below in TABLE II. Each exposed precursor was heated using a vacuum hotplate at 120° C. for 60 seconds. Each heated precursor was then immersed in well agitated distilled water for 4 minutes to allow the reactive composition in the non-exposed regions to be washed off of the substrate. All washed precursors were then immersed in a 0.4 molar silver nitrate solution for 1 minute, rinsed in distilled water for 2 minutes, immersed in a 1 weight % of dimethylamine borane (DMAB) bath for 1 minute, followed by a distilled water rinse for 2 minutes, and dried under nitrogen. The Status M visual density was then measured for both exposed and non-exposed areas of each intermediate article that was then immersed in the electroless copper plating bath described above for 10 minutes, washed in distilled water for 4 minutes, and dried under nitrogen. The exposed regions were measured for resistance with an ohmmeter using the two probe method with separation of 1 cm. The results are shown below in TABLE II. In addition to conductivity in broad exposed areas, line widths of 5 to 6 μm diameter were also faithfully reproduced.

TABLE II

| Example | Photo-sensitizer | Exposure time (seconds) | Non-exposed Region Density | Exposed Region Density | Resistance (ohms) |
| --- | --- | --- | --- | --- | --- |
| Comparative 3 | None | 2 | 0.021 | 0.021 | not conductive |
| Invention 18 | None | 10 | 0.021 | 0.113 | 0.5 |
| Invention 19 | BSS1 | 2 | 0.021 | 0.113 | 0.5 |
| Invention 20 | BSS1 | 10 | 0.021 | 0.124 | 0.5 |
| Invention 21 | BSS2 | 2 | 0.023 | 0.109 | 0.5 |
| Invention 22 | BSS2 | 10 | 0.023 | 0.117 | 0.5 |

The results provided in TABLE II show that both photosensitizers increased the sensitivity of the reactive composition to UV light from 220-260 nm by a factor of 5. That is to say, the reactive compositions containing one of the photosensitizer provided acceptable results with 2 second exposures, while the reactive compositions containing no photosensitizer required a 10 second exposure to yield an acceptable result. The exposing device used in these Invention Examples provided more intense irradiation than the exposing device used for Invention Examples 1-17 so the amounts of exposure are not comparable even if the exposure times were the same.

Invention Example 23

A 7.09 weight % solution (9.79 g) of reactive Polymer A2, 0.1 g of a 2.5 weight % solution of Dupont Capstone FS-35 surfactant, and 0.31 g of distilled water were added to a 10 g sample container, mixed, and then spin coated at 1200 RPM onto the same substrate as for Invention Example 18 to provide a precursor article.

Invention Example 24

A 9.12 weight % solution (7.46 g) of reactive Polymer B, 0.1 g of a 2.5 weight % solution of Dupont Capstone FS-35 surfactant, and 2.44 g of distilled water were added to a 10 g sample container, mixed, and then spin coated at 1200 RPM onto the same substrate as for Inventive Example 18 to provide a precursor article.

Invention Example 25

An 8.32 weight % solution (8.17 g) of reactive Polymer C, 0.1 g of a 2.5 weight % solution of Dupont Capstone FS-35 surfactant, and 1.73 g distilled water were added to a 10 g sample container, mixed, and then spin coated at 1200 RPM onto the same substrate as for Invention Example 18 to provide a precursor article.

Invention Example 26

An 11.63 weight % solution (5.85 g) of reactive Polymer D, 0.1 g of a 2.5 weight % solution of Dupont Capstone FS-35 surfactant, and 4.05 g of distilled water were added to a 10 g sample container, mixed, and then spin coated at 1200 RPM onto the same substrate as for Invention Example 18 to provide a precursor article.

Samples of the precursor articles described above were exposed to 220-260 nm ultraviolet light through a chrome-on-quartz contact mask for various times as shown below in TABLE III. Each exposed precursor was heated using a vacuum hotplate at 120° C. for 60 seconds. The heated precursors were then immersed in well agitated distilled water for 4 minutes to allow the reactive composition in the non-exposed regions to be washed off of the substrate. All washed precursors were then immersed in a 0.4 molar silver nitrate solution for 1 minute, rinsed in distilled water for 2 minutes, immersed in a 1 weight % dimethylamine borane (DMAB) bath for 1 minute, followed by a distilled water rinse for 2 minutes, and dried under nitrogen. The Status M visual density was then measured for both exposed and non-exposed regions of the mask. The intermediate articles were immersed in the electroless copper plating bath described above for 10 minutes, washed in distilled water for 4 minutes, and dried under nitrogen. The exposed regions were measured for resistance with an ohmmeter using the two probe method with separation of 1 cm. The results are shown below in TABLE III. In addition to conductivity in the broad exposed areas, line widths of 5 to 6 µm diameter were also faithfully reproduced.

TABLE III

| Example | Reactive Polymer | Exposure time (seconds) | Non-exposed Density | Exposed density | Resistance (ohms) |
|---|---|---|---|---|---|
| Invention 23 | A2 | 10 | 0.016 | 0.130 | 0.4 |
| Invention 24 | B | 10 | 0.020 | 0.132 | 0.5 |
| Invention 25 | C | 250 | 0.018 | 0.199 | 0.5 |
| Invention 26 | D | 250 | 0.022 | 0.089 | 0.4 |

The results in TABLE III show that all four reactive polymers produced conductive broad areas and fine conductive lines. The results provided using reactive Polymers A2 and B show similar density and conductivity attributes despite the changes in monomer ratio. The results provided by reactive Polymers C and D show that both methods of reactive polymer formation, using a monomer containing a thiosulfate group (reactive Polymer C) or converting a chloride benzyl group to a thiosulfate group after polymerization (reactive Polymer D), provide similar results. However, the two sulfonate containing reactive Polymers C and D required considerably more UV exposure to obtain an acceptable conductive pattern when compared to the carboxylate containing reactive Polymers A and B.

Comparative Example 4 and Invention Examples 27-29

A 9.12 weight % solution (8.22 g) of reactive Polymer B, 0.1 g of a 2.5 weight % solution of Dupont Capstone FS-35 surfactant, and 1.68 g of distilled water were added to a 10 g sample container, mixed, and then spin coated at 1200 RPM onto the same substrate as for Invention Example 18 to provide a precursor article.

Invention Examples 30-33

A 10.57 weight % solution (7.10 g) of reactive Polymer A2, 0.1 g of a 2.5 weight % solution of Dupont Capstone FS-35 surfactant, and 2.80 g of distilled water were added to a 10 g sample container, mixed, and then spin coated at 1200 RPM onto the same substrate as for Invention Example 18 to provide precursor articles.

Invention Examples 34-37

A 10.15 weight % solution (7.39 g) of reactive Polymer E, 0.1 g of a 2.5 weight % solution of Dupont Capstone FS-35 surfactant, and 2.51 g of distilled water were added to a 10 g sample container, mixed, and then spin coated at 1200 RPM onto the same substrate as for Invention Example 18 to provide precursor articles.

Comparative Examples 5-8

A 10.22 weight % solution (7.34 g) of reactive Polymer F, 0.1 g of a 2.5 weight % solution of Dupont Capstone FS-35 surfactant, and 2.56 g of distilled water were added to a 10 g sample container, mixed, and then spin coated at 1200 RPM onto the same substrate as for Invention Example 18 to provide precursor articles.

Comparative Examples 9-12

An 11.42 weight % solution (6.57 g) of reactive Polymer G, 0.1 g of a 2.5 weight % solution of Dupont Capstone FS-35 surfactant, and 3.33 g of distilled water were added to a 10 g sample container, mixed, and then spin coated at 1200 RPM onto the same substrate as for Invention Example 18 to provide precursor articles.

The precursor articles were exposed to 220-260 nm ultraviolet light through a chrome-on-quartz contact mask for various times as shown below in TABLE IV. Each exposed precursor was heated using a vacuum hotplate at 120° C. for 60 seconds. The heated precursors were then immersed in well agitated distilled water or a 0.5 weight % sodium bicarbonate bath for 4 minutes to allow the reactive composition in the non-exposed regions to be washed off of the substrate. All washed precursors were then immersed in a 0.4 molar silver nitrate solution for 1 minute, rinsed in distilled water for 2 minutes, immersed in a 1 weight % dimethylamine borane (DMAB) bath for 1 minute, followed by a distilled water rinse for 2 minutes, and dried under nitrogen. The Status M visual density was then measured for both exposed and non-exposed regions of the polymeric layer. The intermediate articles were immersed in the electroless copper plating bath described above for 9 minutes, washed in distilled water for 4 minutes, and dried under nitrogen. The Status M visual density (density 2) was then measured for both exposed and non-exposed areas of the mask. The results are shown below in TABLE IV. In addition to conductivity in broad exposed areas, line widths of 5 to 6 μm diameter were also faithfully reproduced.

TABLE IV

| Example | Reactive Polymer | Exposure Time (seconds) | Non-exposed Region Density 1 | Exposed Region Density 1 | Non-exposed Region Density 2 | Exposed Region Density 2 |
|---|---|---|---|---|---|---|
| Comparative 4 | B | 2 | 0.021 | 0.021 | 0.236 | 0.803 |
| Invention 27 | B | 10 | 0.020 | 0.161 | 0.019 | 3.521 |
| Invention 28 | B | 50 | 0.021 | 0.194 | 0.020 | 4.086 |
| Invention 29 | B | 250 | 0.021 | 0.209 | 0.020 | 3.566 |
| Invention 30 | A2 | 2 | 0.020 | 0.041 | 0.020 | 3.239 |
| Invention 31 | A2 | 10 | 0.021 | 0.171 | 0.022 | 3.280 |
| Invention 32 | A2 | 50 | 0.021 | 0.171 | 0.020 | 4.162 |
| Invention 33 | A2 | 250 | 0.021 | 0.166 | 0.020 | 3.813 |
| Invention 34 | E | 2 | 0.016 | 0.051 | 0.019 | 4.600 |
| Inventive 35 | E | 10 | 0.017 | 0.121 | 0.019 | 4.235 |
| Invention 36 | E | 50 | 0.017 | 0.125 | 0.019 | 3.728 |
| Invention 37 | E | 250 | 0.017 | 0.127 | 0.019 | 3.225 |
| Comparative 5 | F | 2 | 0.018 | 0.018 | 0.019 | 0.027 |
| Comparative 6 | F | 10 | 0.018 | 0.070 | 0.019 | 2.448 |
| Comparative 7 | F | 50 | 0.018 | 0.081 | 0.019 | 0.213 |
| Comparative 8 | F | 250 | 0.019 | 0.084 | 0.020 | 0.072 |
| Comparative 9 | G | 2 | 0.038 | 0.070 | 0.060 | 2.260 |
| Comparative 10 | G | 10 | 0.041 | 0.053 | 0.062 | 0.096 |
| Comparative 11 | G | 50 | 0.042 | 0.060 | 0.068 | 0.063 |
| Comparative 12 | G | 250 | 0.026 | 0.059 | 0.073 | 0.047 |

The results provided in TABLE IV show that it is important for the UV exposure to be high enough to effectively crosslink the reactive polymer. This is illustrated by the low UV exposure of reactive Polymer B in Comparative Example 4 relative to the higher exposures for reactive Polymer B in Invention Examples 27-29. Reactive Polymers A2 and E were derived using a higher molar proportion of the crosslinking ethylenically unsaturated polymerizable monomer, and thus were more reactive at the same lower exposure compared to reactive Polymer B. However, when the crosslinking ethylenically unsaturated polymerizable monomer was too high as in reactive Polymers F and G (40 and 50 mol %, respectively), the resulting crosslinking was too low at low UV exposures and too high at higher UV exposures such that the reactive polymer was removed in the first water bath (low UV exposure) and less permeable to the processing solutions (crosslinking too high). This is illustrated in Comparative Examples 5-12.

Invention Example 38

A 10.57 weight % solution (7.10 g) of reactive Polymer A2, 0.1 g of a 2.5 weight % solution of Dupont Capstone FS-35 surfactant, and 2.80 g of distilled water were added to a 10 g sample container, mixed, and then spin coated at 1200 RPM onto the same substrate as for Invention Example 18 to provide a precursor article.

Invention Example 39

An 8.32% solution (9.10 g) of reactive Polymer C, 0.1 g of a 2.5 weight % solution of Dupont Capstone FS-35 surfactant, and 0.89 g distilled water were added to a 10 g sample container, mixed, and then spin coated at 1200 RPM onto the same substrate as for Invention Example 18 to provide a precursor article.

Invention Example 40

An 11.63 weight % solution (6.45 g) of reactive Polymer D, 0.1 g of a 2.5 weight % solution of Dupont Capstone FS-35 surfactant, and 3.45 g of distilled water were added to a 10 g sample container, mixed, and then spin coated at 1200 RPM onto the same substrate as for Invention Example 18 to provide a precursor article.

Invention Example 41

A 9.90 weight % solution (7.58 g) of reactive Polymer H, 0.1 g of a 2.5 weight % solution of Dupont Capstone FS-35 surfactant, and 2.32 g of distilled water were added to a 10 g sample container, mixed, and then spin coated at 1200 RPM onto the same substrate as for Invention Example 18 to provide a precursor article.

The precursor articles were exposed to 220-260 nm ultraviolet light through a chrome-on-quartz contact mask for 250 seconds. Each exposed precursor was heated using a vacuum hotplate at 120° C. for 60 seconds. Each heated precursor was then immersed in well agitated distilled water for 4 minutes to allow the reactive composition in the non-exposed regions to be removed from the substrate. All washed precursors were then immersed in a 0.4 molar silver nitrate solution for 1 minute, rinsed in distilled water for 2 minutes, immersed in a 1 weight % dimethylamine borane (DMAB) bath for 1 minute, followed by a distilled water rinse for 2 minutes, and dried under nitrogen. The Status M visual density was then measured for both exposed and non-exposed regions of the polymeric layer. The intermediate precursors were immersed in the electroless copper plating bath described above for 10 minutes, washed in distilled water for 4 minutes, and dried under nitrogen. The exposed regions were measured for resistance with an ohmmeter using the two probe method with separation of 1 cm. The results are shown below in TABLE V.

TABLE V

| Example | Reactive Polymer | Exposure Time (seconds) | Non-exposed Region Density | Exposed Region Density | Resistance (ohms) |
|---|---|---|---|---|---|
| Invention 38 | A2 | 250 | 0.018 | 0.151 | 0.5 |
| Invention 39 | C | 250 | 0.017 | 0.222 | 0.5 |
| Invention 40 | D | 250 | 0.019 | 0.170 | 0.5 |
| Invention 41 | H | 250 | 0.016 | 0.079 | 0.5 |

The results shown in TABLE V show that all four reactive polymers according to the present invention provided conductive properties. In addition to conductivity in broad exposed areas, line widths of 5 to 6 μm diameter were also faithfully reproduced.

The invention has been described in detail with particular reference to certain preferred embodiments thereof, but it will be understood that variations and modifications can be effected within the spirit and scope of the invention.

The invention claimed is:

1. A method of forming a pattern in a polymeric layer, the method comprising:
    providing a polymeric layer on a substrate, which polymeric layer comprises a reactive composition comprising a non-crosslinked thiosulfate copolymer comprising, in any order: (a) recurring units comprising pendant thiosulfate groups, and (b) recurring units comprising pendant carboxy, carboxylate, phospho, phosphonate, phosphate, sulfo, sulfonate, or sulfite groups, wherein the (a) recurring units are present in an amount of at least 1 mol % and up to and including 30 mol %, and the (b) recurring units are present in an amount of at least 70 mol % and up to and including 99 mol %, both based on total recurring units in the non-crosslinked thiosulfate copolymer,
    patternwise exposing the polymeric layer to radiation having a $\lambda_{max}$ of at least 150 nm that is sufficient to induce crosslinking within the non-crosslinked thiosulfate copolymer, to provide a polymeric layer comprising non-exposed regions and exposed regions comprising a crosslinked polymer derived from the non-crosslinked thiosulfate copolymer,
    optionally heating the polymeric layer simultaneously with or after patternwise exposing the polymeric layer but before removing the reactive composition comprising the non-crosslinked thiosulfate copolymer in the non-exposed regions, at a temperature sufficient to further crosslink the crosslinked polymer in the exposed regions of the polymeric layer,
    removing the reactive composition comprising the non-crosslinked thiosulfate copolymer in the non-exposed regions,
    contacting the exposed regions of the polymeric layer comprising crosslinked polymer with electroless seed metal ions to form a pattern of electroless seed metal ions in the exposed regions of the polymeric layer,
    reducing the pattern of electroless seed metal ions with a reducing agent for the electroless seed metal ions to provide a pattern of corresponding electroless seed metal nuclei in the exposed regions of the polymeric layer, and
    electrolessly plating the corresponding electroless seed metal nuclei in the exposed regions of the polymeric layer with a metal that is the same as or different from the corresponding electroless seed metal nuclei.

2. The method of claim 1, wherein the reactive composition further comprises a photosensitizer in an amount of at least 1 weight %, which photosensitizer provides sensitization at a $\lambda_{max}$ of at least 150 nm and up to and including 700 nm.

3. The method of claim 1, wherein the non-crosslinked thiosulfate copolymer comprises the (a) recurring units in an amount of at least 5 mol % and up to and including 20 mol %, and the (b) recurring units in an amount of at least 70 mol % and up to and including 95 mol %, all based on the total recurring units in the non-crosslinked thiosulfate copolymer.

4. The method of claim 1, wherein the (b) recurring units comprise pendant carboxylic acid, carboxylate, sulfonic acid, or sulfonate groups.

5. The method of claim 1, wherein the non-crosslinked thiosulfate copolymer further comprises one or more additional (c) recurring units that are different from all of the (a) and (b) recurring units, the one or more additional (c) recurring units being present in an amount of up to and including 30 mol %, based on the total recurring units in the non-crosslinked thiosulfate copolymer.

6. The method of claim 1, wherein:
    the heating of the polymeric layer is required and is carried out after patternwise exposing the polymeric layer but before removing the non-crosslinked thiosulfate copolymer in the non-exposed regions, at a temperature sufficient to further crosslink the crosslinked polymer in the exposed regions of the polymeric layer.

7. The method of claim 1, wherein the electroless seed metal ions are selected from the group consisting of silver ions, platinum ions, palladium ions, gold ions, rhodium ions, nickel ions, iridium ions, tin ions, and copper ions.

8. The method of claim 1, wherein the metal for the electrolessly plating is selected from the group consisting of copper(II), silver(I), gold(IV), palladium(II), platinum(II), nickel(II), chromium(II), and combinations thereof.

9. The method of claim 1, wherein the patternwise exposing of the polymeric layer is carried out at to radiation having a $\lambda_{max}$ of at least 150 nm and up to and including 450 nm.

10. The method of claim 1, wherein the reducing agent for the electroless seed metal ions in the exposed regions of the polymeric layer is a borane, aldehyde, hydroquinone, or sugar reducing agent.

* * * * *